United States Patent
Jang

(10) Patent No.: US 11,815,949 B2
(45) Date of Patent: *Nov. 14, 2023

(54) DISPLAY DEVICE

(71) Applicant: Samsung Display Co., Ltd., Yongin-si (KR)

(72) Inventor: Nam Jin Jang, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/739,622

(22) Filed: May 9, 2022

(65) Prior Publication Data

US 2022/0261036 A1 Aug. 18, 2022

Related U.S. Application Data

(63) Continuation of application No. 16/555,136, filed on Aug. 29, 2019, now Pat. No. 11,327,528.

(30) Foreign Application Priority Data

Aug. 31, 2018 (KR) ........................ 10-2018-0103476

(51) Int. Cl.
*G06F 1/16* (2006.01)
*H05K 5/06* (2006.01)
*H05K 5/00* (2006.01)

(52) U.S. Cl.
CPC ......... *G06F 1/1626* (2013.01); *H05K 5/0017* (2013.01); *H05K 5/064* (2013.01)

(58) Field of Classification Search
CPC ... G06F 1/1626; G06F 1/1656; H05K 5/0017; H05K 5/064; H05K 5/06; H04M 1/0266;
(Continued)

(56) References Cited

U.S. PATENT DOCUMENTS 6,652,312 B2 11/2003 Liegl et al.
8,442,593 B1 * 5/2013 Kwon ................. H04M 1/0266
455/575.8

(Continued)

FOREIGN PATENT DOCUMENTS

CN 1381081 A 11/2002
CN 107665063 A 2/2018
(Continued)

*Primary Examiner* — Abhishek M Rathod
*Assistant Examiner* — Keith DePew
(74) *Attorney, Agent, or Firm* — CANTOR COLBURN LLP

(57) ABSTRACT

A display device includes a housing including first and second edge areas; a panel assembly between a window and the housing; a first waterproof member corresponding to the first edge area; a second waterproof member corresponding to the second edge area and disconnected from the first waterproof member; and a first sealing member in contact with the first and second waterproof members, the panel assembly, the window and the housing. The panel assembly includes a plurality of members each protruded further than an end of the first waterproof member to respectively define first edges. Each first edge is in contact with the first sealing member, and protruded distances of the first edges from the end of the first waterproof member increase as a cross-sectional distance from the plurality of members to the window decreases to form a stepped shape of the panel assembly at the first edges.

14 Claims, 18 Drawing Sheets

(58) Field of Classification Search
CPC .......... H04M 1/18; H04M 1/026; G09F 9/00; G02B 5/30
See application file for complete search history.

(56) References Cited

U.S. PATENT DOCUMENTS

| | | | | |
|---|---|---|---|---|
| 9,342,105 | B2* | 5/2016 | Choi | G06F 1/182 |
| 9,872,408 | B2* | 1/2018 | Choi | G06F 1/1637 |
| 9,992,893 | B2* | 6/2018 | Choi | H05K 5/069 |
| 10,251,291 | B2* | 4/2019 | Ahn | G06F 1/1626 |
| 10,312,299 | B2 | 6/2019 | Jun et al. | |
| 10,527,877 | B2* | 1/2020 | Ochi | H04M 1/0266 |
| 10,613,586 | B2* | 4/2020 | Yamazaki | G06F 1/1618 |
| 10,674,572 | B2* | 6/2020 | Cho | H04M 1/02 |
| 10,741,621 | B2* | 8/2020 | Choo | H10K 59/65 |
| 11,327,528 | B2* | 5/2022 | Jang | G06F 1/1656 |
| 2009/0054115 | A1 | 2/2009 | Horrdin et al. | |
| 2012/0236479 | A1 | 9/2012 | Tamai et al. | |
| 2016/0170443 | A1* | 6/2016 | Namkung | G06F 1/16 445/24 |
| 2017/0099742 | A1* | 4/2017 | Choi | H05K 5/03 |
| 2018/0074553 | A1* | 3/2018 | Yamazaki | H05B 33/02 |
| 2018/0098446 | A1* | 4/2018 | Choi | G06F 1/1656 |
| 2018/0151641 | A1* | 5/2018 | Choo | G06F 1/1684 |
| 2018/0364846 | A1* | 12/2018 | Ahn | G06F 3/0412 |
| 2019/0006615 | A1* | 1/2019 | Jung | H10K 59/40 |
| 2019/0014671 | A1* | 1/2019 | Ahn | H05K 1/028 |
| 2019/0018275 | A1* | 1/2019 | Ochi | G06F 1/1637 |
| 2019/0254129 | A1* | 8/2019 | Cho | H05B 33/04 |
| 2020/0073436 | A1* | 3/2020 | Jang | H04M 1/18 |

FOREIGN PATENT DOCUMENTS

| | | |
|---|---|---|
| JP | 201828503 A | 2/2018 |
| KR | 2020120000258 U | 1/2012 |
| KR | 1020150082042 A | 7/2015 |
| KR | 1020180026191 A | 3/2018 |

\* cited by examiner

DISPLAY DEVICE

The application is a continuation application of U.S. application Ser. No. 16/555,136 filed Aug. 29, 2019 and issued as U.S. Pat. No. 11,327,528 on May 10, 2022, which claims priority to Korean Patent Application No. 10-2018-0103476, filed Aug. 31, 2018, and all the benefits accruing therefrom under 35 U.S.C. § 119, the content of which in its entirety is herein incorporated by reference.

BACKGROUND

(1) Field

Exemplary embodiments relate to a display device.

(2) Description of the Related Art

With the development of information technology, the importance of display devices, which are a connection medium between users and information, has been emphasized. In response to such a connection medium, the use of display devices such as a liquid crystal display device, an organic light emitting display device, and a plasma display device has been increasing.

A waterproof structure may be employed in a bezel area of a display device corresponding to an outer area of the display area of the display device, in order to secure a stable display function irrespective of changes in the external environment of the display device. It is desirable to minimize the bezel area to ensure a sufficient display area.

SUMMARY

One or more exemplary embodiment provides a display device including a waterproof structure that can be combined with other members the display device having various shapes in the minimized bezel area of the display device.

According to an exemplary embodiment, a display device includes: a panel assembly which displays an image; a housing in which the panel assembly is disposed, the housing including a first edge area extending along a first direction and a second edge area extending along a second direction intersecting the first direction; a window disposing the panel assembly between the housing and the window; a first waterproof member between the panel assembly and the housing at the first edge area thereof; a second waterproof member between the window and the housing at the second edge area thereof, the second waterproof member being disconnected from the first waterproof member to define a space therebetween; and a first sealing member in contact with each of the first waterproof member, the second waterproof member, the panel assembly, the window and the housing, at the space between the first and second waterproof members. The panel assembly includes a plurality of members each protruded in the first direction further than an end of the first waterproof member to respectively define first edges of the plurality of members, the first edges disposed in the space between the first and second waterproof members. In the space between the first and second waterproof members: each first edge is in contact with the first sealing member, and protruded distances of the first edges from the end of the first waterproof member increase as a cross-sectional distance from the plurality of members to the window decreases to form a stepped shape of the panel assembly at the first edges thereof.

The plurality of members may include an optical adhesive film in contact with the window, a display panel, and a polarizing film between the optical adhesive film and the display panel.

An entirety of a first edge of the optical adhesive film may be disposed further in the first direction further from the end of the first waterproof member than an entirety of a first edge of the polarizing film.

The plurality of members may further include a cover panel, and the display panel may be positioned between the polarizing film and the cover panel.

The cover panel may include a cushion member and a conductive thin film.

An entirety of a first edge of the display panel may be disposed further in the first direction from the end of the first waterproof member than an entirety of the first edge of the cover panel.

The housing may further include a third edge area extending along the second direction and spaced apart from the second edge area along the first direction, and the display device may further include a third waterproof member between the window and the housing at the third edge area thereof, and a second sealing member in contact with each of the first waterproof member, the third waterproof member, the panel assembly, the window, and the housing. The plurality of members may each be protruded in a direction opposite to the first direction further than an end of the third waterproof member to respectively define second edges of the panel assembly, each second edge being in contact with the second sealing member. Protruded distances of the second edges from the end of the third waterproof member may increase as the cross-sectional distance from the plurality of members to the window decreases to form a stepped shape of the panel assembly at the second edges thereof.

The plurality of members may respectively define second edges thereof which are opposite to the first edges thereof along a direction opposite to the first direction, and the second edges may be aligned with each other.

Along the second direction, a first portion of the first edge of the cover panel may be disposed closer to an end of the panel assembly than a second portion of the first edge of the cover panel. Along a direction opposite to the first direction, the first portion of the first edge of the cover panel may be disposed further from the first edge of the display panel than the second portion of the first edge of the cover panel.

The housing may further include a third edge area extending along the second direction and spaced apart from the second edge area along the first direction, and the display device may further include a third waterproof member between the window and the housing at the third area thereof, and a second sealing member in contact with each of the first waterproof member, the third waterproof member, the panel assembly, the window, and the housing. The plurality of members may each be protruded in a direction opposite to the first direction further than an end of the third waterproof member to respectively define second edges of the plurality of member, each second edge being in contact with the second sealing member. Protruded distances of the second edges from the end of the third waterproof member increase as the cross-sectional distance from the plurality of members to the window decreases to form a stepped shape of the panel assembly at the second edges thereof.

The plurality of members may respectively define second edges thereof which are opposite to the first edges thereof along a direction opposite to the first direction, and the second edges may be aligned with each other.

The first edge of the display panel and the first edge of the polarizing film may be aligned with each other.

A first protruded distance of the optical adhesive film may be defined by a first process deviation of a first cutting process in which the display panel and the polarizing film are cut together at the first edges thereof, a second process deviation of a second cutting process in which the optical adhesive film is cut at the first edge thereof, a third process deviation of a manufacturing process in which a release paper which is removable applied to the optical adhesive film is manufactured, and a fourth process deviation of an adhesive process in which the optical adhesive film and the polarizing film are adhered to each other.

The first protruded distance may be calculated by the following Equation 1, when the first protruded distance is d1, the first process deviation is a, the second process deviation is b, the third process deviation is c, and the fourth process deviation is d.

$$d1 = \sqrt{a^2 + b^2 + c^2 + d^2}$$ [Equation 1]

A second protruded distance of the cover panel may correspond to a fifth process deviation of a manufacturing process in which the cover panel is manufactured.

Along the second direction, a first portion of a first edge of the optical adhesive film may be disposed closer to an end of the panel assembly than a second portion of the first edge of the optical adhesive film. Along the first direction, the first portion of the first edge of the optical adhesive film may be disposed further from a first edge of the polarizing film than the second portion of the first edge of the optical adhesive film.

The plurality of members may further include a cover panel, and the display panel may be positioned between the polarizing film and the cover panel.

An entirety of a first edge of the display panel may be disposed further in the first direction from the end of the first waterproof member than an entirety of the first edge of the cover panel.

Along the second direction, a first portion of the first edge of the cover panel may be disposed closer to an end of the panel assembly than a second portion of the first edge of the cover panel. Along a direction opposite to the first direction, the first portion of the first edge of the cover panel may be disposed further from a first edge of the display panel than the second portion of the first edge of the cover panel.

BRIEF DESCRIPTION OF THE DRAWINGS

The accompanying drawings, which are included to provide a further understanding of the invention, and are incorporated in and constitute a part of this specification, illustrate exemplary embodiments of the invention, and, together with the description, serve to explain principles of the invention.

DETAILED DESCRIPTION

Figure 1:
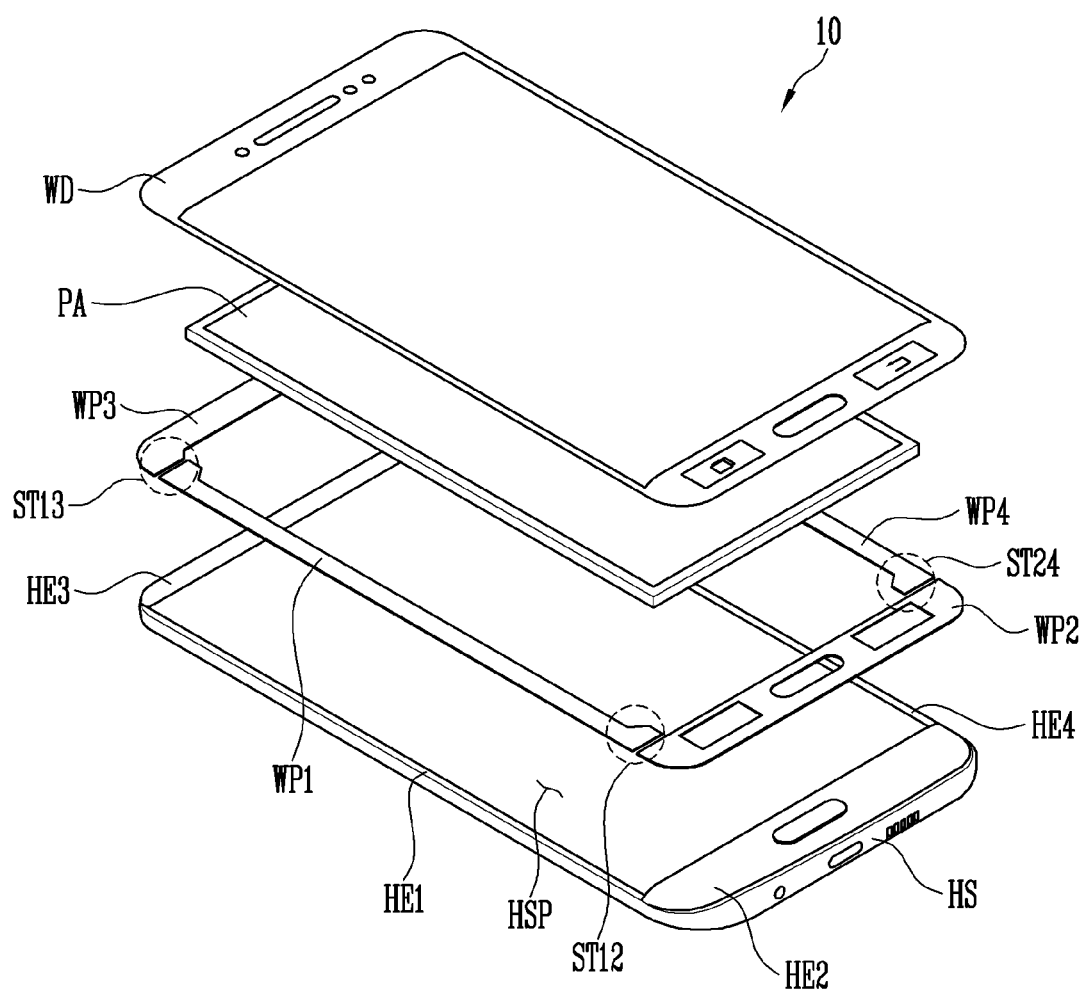
FIGS. 1 and 2 are perspective views illustrating an embodiment of a display device according to the invention.

Hereinafter, embodiments of the invention will be described in detail with reference to the accompanying drawings so that those skilled in the art can easily carry out the invention. The invention may be embodied in various forms and is not limited to the embodiments described herein.

In order to clearly illustrate the invention, parts not related to the description are omitted. Throughout the specification, the same or similar components are denoted by the same reference numerals. Therefore, the above-mentioned reference numerals can be used in other drawings.

In addition, the size and thickness of each component shown in the drawings are arbitrarily shown for convenience of explanation. The invention is not necessarily limited to those shown in the drawings. In the drawings, thicknesses may be exaggerated for clarity of presentation of layers and regions.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region,"

"layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

A waterproof structure may be employed in a minimized bezel area of a display device corresponding to an outer area of the display area of the display device, in order to secure a stable display function irrespective of changes in the external environment of the display device. In the minimized bezel area, a waterproof structure may be combined with other members of various shapes included in the display device.

Figure 2:
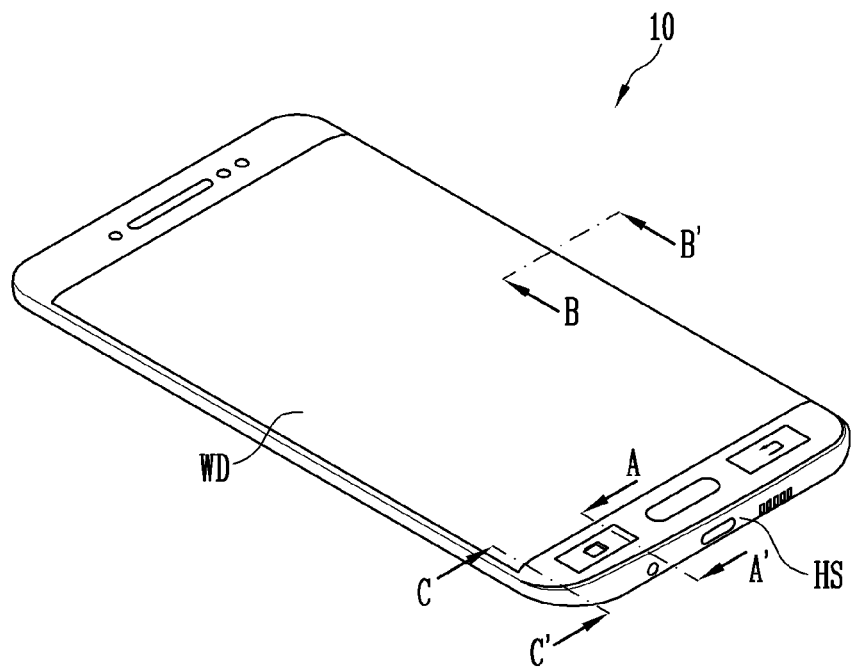

FIGS. 1 and 2 are perspective views illustrating an embodiment of a display device according to the invention.

Referring to FIGS. 1 and 2, a display device 10 according to an embodiment of the invention may include a housing HS, waterproof members WP1, WP2, WP3 and WP4, a panel assembly PA, and a window WD. The display device 10 and components thereof may be disposed in a plane defined by a first direction and a second direction which cross each other. In FIGS. 1 and 2, for example, a relatively long dimension of the display device 10 may be extended in the first direction, which a relatively short dimension of the display device 10 may be extended in the second direction. A thickness of the display device 10 and components thereof may be taken in a third direction which crosses each of the first and second directions.

The housing HS is coupled with the window WD, thereby fixing positions of internal parts of the display device 10 and protecting the internal parts from external shocks and the like. The housing HS and the window WD may form an outer surface of the display device 10, and may be exposed to the environment which is external to the display device 10.

The housing HS may include a first area HE1 and a second area HE2. In another embodiment, the housing HS may optionally further include a third area HE3 and a fourth area HE4. Each of these areas of the housing HS are disposed at an edge portion of the housing HS.

The first to fourth areas HE1 to HE4 of the housing HS may correspond to a bezel area of the display device 10. In addition, the first to fourth areas HE1 to HE4 of the housing HS may correspond to attachment surfaces to which the first to fourth waterproof members WP1 to WP4 are attached.

The housing HS may further include an accommodation space HSP surrounded by the first to fourth areas HE1 to HE4. The accommodation space HSP may accommodate therein batteries, antennas, electronic circuit components, and the like among components and internal parts of the display device 10.

The first to fourth waterproof members WP1 to WP4 may provide an adhesive function and a waterproof function. In an embodiment, for example, the first to fourth waterproof members WP1 to WP4 may be a double-sided adhesive tape having a waterproof function. The adhesive function and the waterproof function may be defined by a material of a waterproof member, a shape or structure of the waterproof member, etc.

The first waterproof member WP1 may be overlapped with the first area HE1. The second waterproof member WP2 may be overlapped with the second area HE2 and spaced apart from the first waterproof member WP1. The first waterproof member WP1 may have a shape defining a length thereof extending in a longitudinal direction (e.g., the relatively long dimension) of the display device 10. The width of the first waterproof member WP1 may extend along the relatively short dimension of the display device 10. The longitudinal direction of the display device 10 may correspond to a first direction DR1 (see FIG. 7).

The second waterproof member WP2 may have a shape defining a length thereof extending in a width direction (e.g., the relatively short dimension) of the display device 10. The width of the second waterproof member WP2 may extend along the relatively long dimension of the display device 10. The width direction of the display device 10 may correspond to a second direction DR2 (see FIG. 7).

Similarly, the third waterproof member WP3 may be overlapped with the third area HE3. The fourth waterproof member WP4 may be overlapped with the fourth area HE4. The first to fourth waterproof members WP1 to WP4 may be spaced apart from each other along the first direction or the second direction, respectively. That is, the first to fourth waterproof members WP1 to WP4 may be disconnected from each other. The third waterproof member WP3 may have a shape defining a length thereof extending in the width direction of the display device 10. The fourth waterproof member WP4 may have a shape defining a length thereof extending in the longitudinal direction of the display device 10.

The panel assembly PA may include a plurality of members stacked together. At least one of the plurality of members may be a display panel which generates and/or displays an image. The display panel may be an organic light emitting display panel, a liquid crystal display panel, or the like. For convenience of description, hereinafter the display panel as an organic light emitting display panel is described.

The panel assembly PA may be overlapped with the first waterproof member WP1. In addition, the panel assembly PA may be overlapped with the fourth waterproof member WP4. That is, the first waterproof member WP1 may provide a waterproof function while adhering the first area HE1 of the housing HS and the panel assembly PA to each other. In addition, the fourth waterproof member WP4 may provide a waterproof function while adhering the fourth area HE4 of the housing HS and the panel assembly PA to each other. Structures of the first and fourth waterproof members WP1 and WP4 described hereinbelow may be substantially the same as each other such that repeated descriptions are omitted.

The panel assembly PA may include or define a display surface at which the image is displayed. The window WD may be engaged with the housing HS while covering the display surface of the panel assembly PA. The window WD includes or is made of a transparent material such as glass, synthetic resin, plastic or the like and can protect the panel assembly PA from an external impact while transmitting the image displayed from the panel assembly PA. That is, the image from the panel assembly PA is provided to the window WD and is visible through the window WD from outside the display device 10.

The window WD may be overlapped with the second waterproof member WP2 and the panel assembly PA. In addition, the window WD may be overlapped with the third waterproof member WP3. That is, the second waterproof member WP2 may provide a waterproof function while adhering the second area HE2 of the housing HS and the window WD to each other. In addition, the third waterproof member WP3 may provide a waterproof function while adhering the third region HE3 of the housing HS and the window WD to each other. Structures of the second and third waterproof members WP2 and WP3 described hereinbelow may be substantially the same as each other such that repeated descriptions are omitted.

Figure 3:
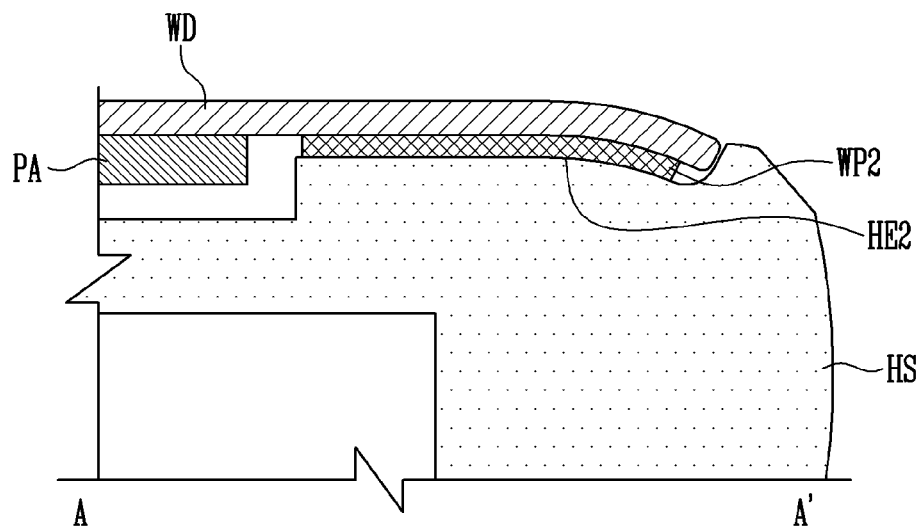
FIG. 3 is an enlarged cross-sectional view of the display device of FIG. 2 taken along line A-A'.
Figure 4:
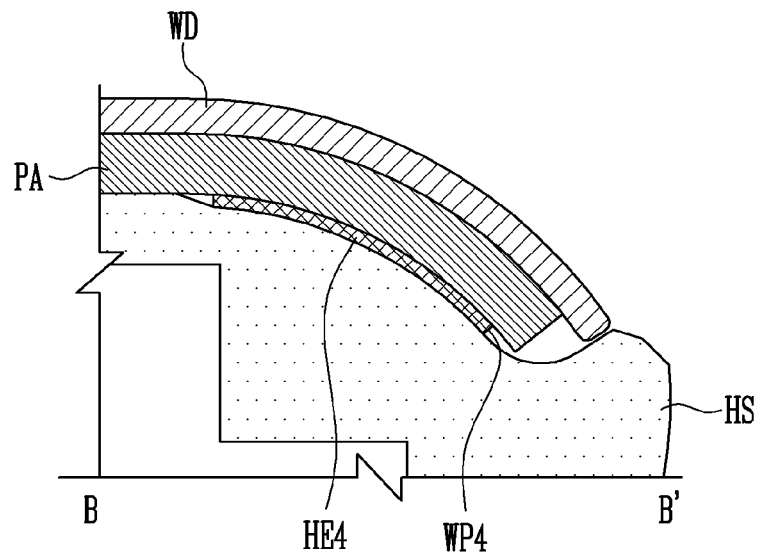
FIG. 4 is an enlarged cross-sectional view of the display device of FIG. 2 taken along line B-B'.
Figure 5:
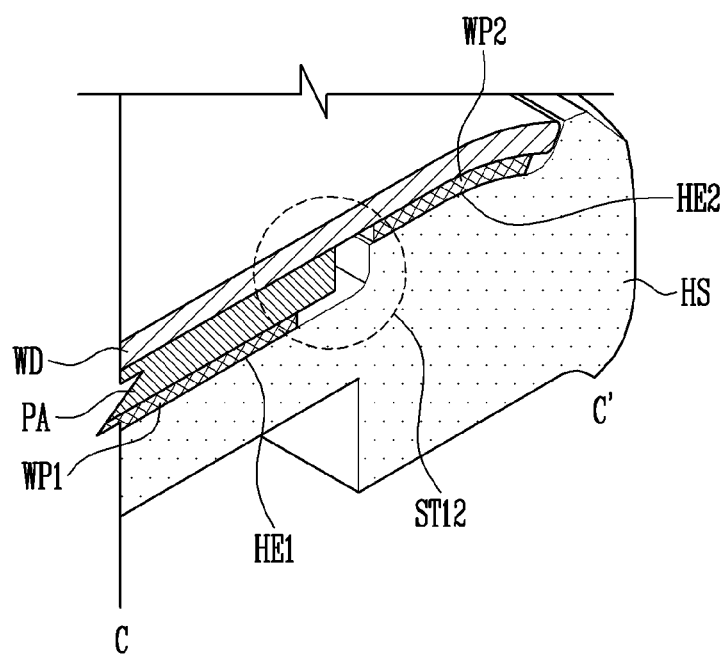
FIG. 5 is an enlarged cross-sectional view of the display device of FIG. 2 taken along line C-C'.
Figure 6:
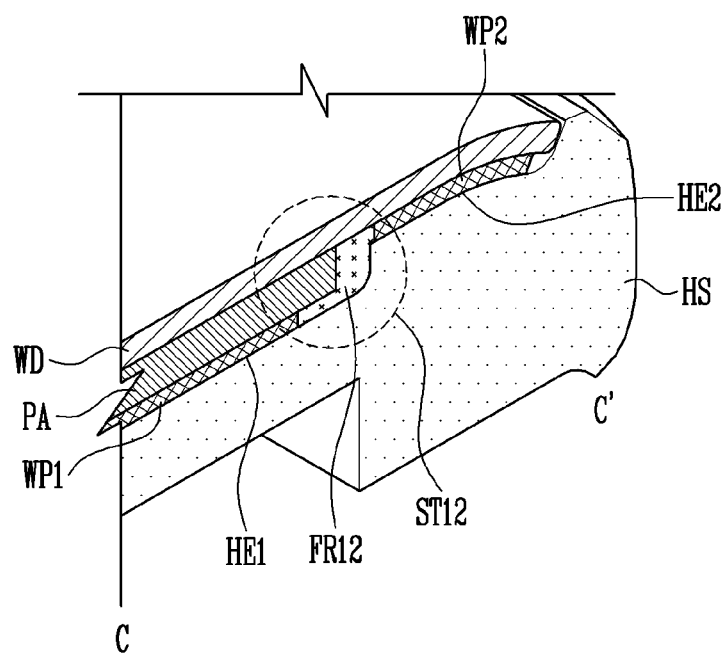
FIG. 6 is an enlarged cross-sectional view of an embodiment of a sealing member of the display device of FIG. 5.

FIG. 3 is an enlarged cross-sectional view of the display device of FIG. 2 taken along line A-A', FIG. 4 is an enlarged cross-sectional view of the display device of FIG. 2 taken along line B-B', FIG. 5 is an enlarged cross-sectional view of the display device of FIG. 2 taken along line C-C', and FIG. 6 is an enlarged cross-sectional view of an embodiment of a sealing member of the display device of FIG. 5. The portion of the display device at line C-C' is disposed at an edge portion of the display device and closer to an outer edge of the display device than the portion of the display device at line A-A'. The lines C-C' and A-A' of the display device in FIG. 2 may be applied to various embodiments of panel assemblies described hereinafter.

Referring to FIGS. 3 and 4, the waterproof function can be realized by the portions of each of the second and fourth waterproof members WP2 and WP4 respectively lengthwise extending in the width direction or the longitudinal direction of the display device 10.

However, referring to FIG. 5, a step difference, e.g., a height difference corresponding to a thickness of the panel assembly PA exists between the second waterproof member WP2 adhered between the window WD and the second area HE2, and the first waterproof member WP1 adhered between the panel assembly PA and the first area HE1. A stepped space ST12 may be formed due to the step difference. The step difference may be defined at a boundary between the first and second areas HE1 and HE2. The stepped space ST12 may be defined by the window WD, the panel assembly PA, the housing HS and the first and second waterproof members WP1 and WP2. The stepped space ST12 may be defined at a region where waterproof members are disconnected from each other, such as at corners of the panel assembly PA, without being limited thereto.

Figure 7:
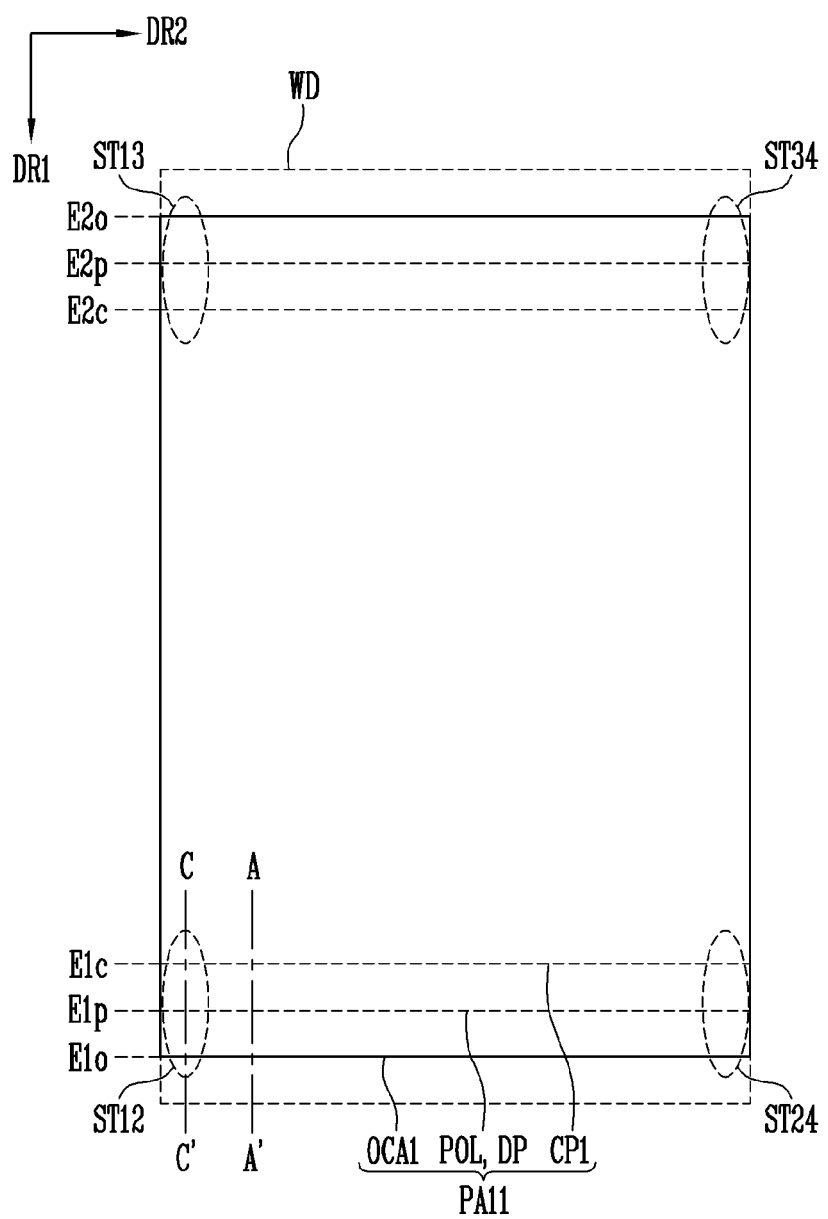
FIG. 7 is a top plan view of an embodiment of a panel assembly of a display device according to the invention.

Similarly, a stepped space ST13 may be formed between the first waterproof member WP1 and the third waterproof member WP3, a stepped space ST24 may be formed between the second waterproof member WP2 and the fourth waterproof member WP4, and a stepped space ST34 may be formed between the third waterproof member WP3 and the fourth waterproof member WP4 (see FIG. 7). When the moisture penetrates through the stepped spaces ST12, ST13, ST24, and ST34, the waterproof function may not be implemented properly.

Referring to FIG. 6, by filling a sealing member FR12 in the stepped space ST12, the waterproof function of the first to fourth waterproof members WP1 to WP4 within the display device 10 can be complemented. The sealing member FR12 may include a thermosetting resin, a viscous resin, silicone, a semi-solid, an elastic resin or the like. At the stepped space ST12, the sealing member FR12 may be in contact with the first waterproof member WP1, the second waterproof member WP2, the panel assembly PA, the window WD, and the housing HS.

In an embodiment, the panel assembly PA may include a plurality of members. When the edges of the plurality of members in contact with the sealing member FR12 are irregularly protruded, the sealing member FR12 may not be completely filled into the stepped space ST12. In this case, since the waterproof function is not fully realized, defects may occur in the display device 10 due to penetration of moisture or the like. The plurality of members of the panel assembly PA can be designed so that edges of the plurality of members are aligned with each other. However, the plurality of members of the panel assembly PA may have process deviations in respective manufacturing processes, and in a process of bonding the plurality of members to each other, the edges contacting the sealing member FR12 may be still be irregularly protruded by the process deviations.

Figure 8:
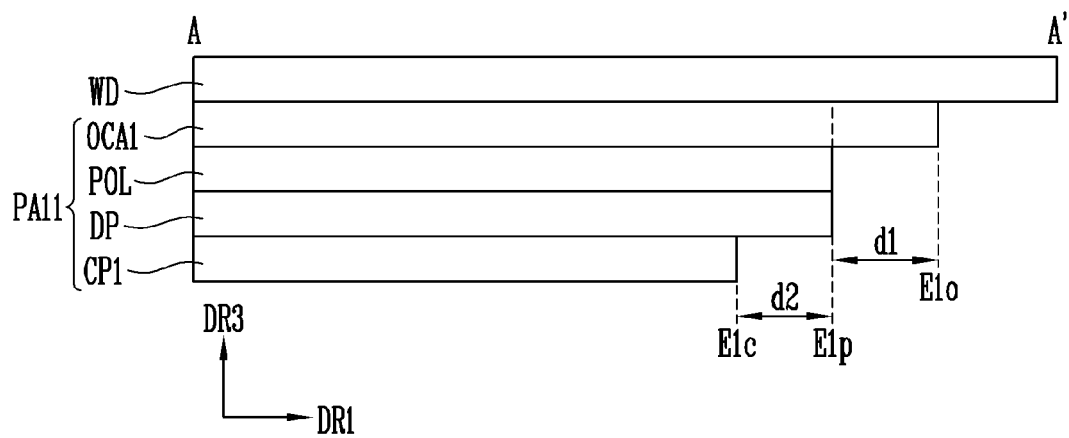
FIGS. 8 and 9 are enlarged cross-sectional views of the panel assembly of FIG. 7 according to the invention.
Figure 9:
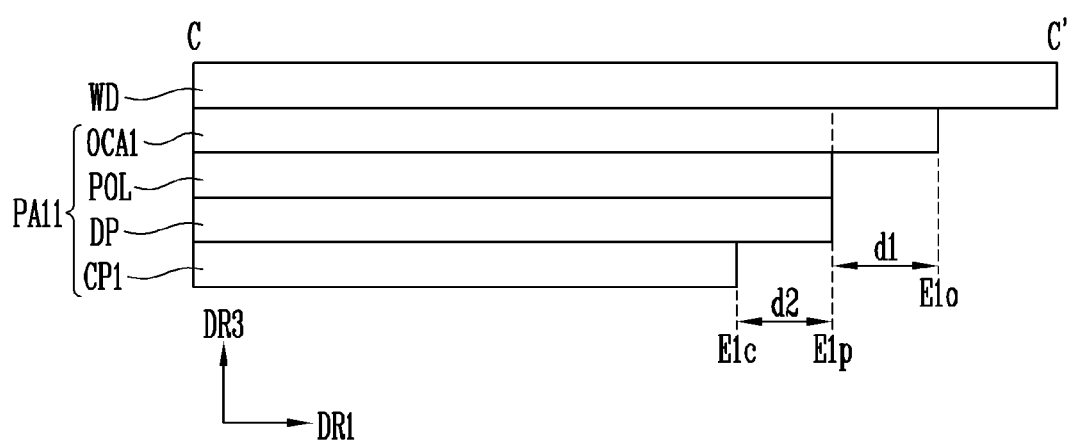

FIG. 7 is a top plan view of an embodiment of a panel assembly of a display device according to the invention and FIGS. 8 and 9 are enlarged cross-sectional views of the panel assembly taken along lines A-A' and C-C', respectively, according to the invention.

Referring to FIGS. 7 to 9, a panel assembly PA11 according to the invention may include an optical adhesive film OCA1, a polarizing film POL, and a display panel DP. Further, as another embodiment, the panel assembly PA11 may further include a cover panel CP1.

The optical adhesive film OCA1 may be in contact with the window WD (opposing edges extending along the second direction DR2 being indicated as dotted lines in FIG. 7). The optical adhesive film OCA1 may be a viscous resin having a high light transmittance close to about 100% after being cured.

The display panel DP may be a panel capable of generating and/or displaying an image, as described above. In an embodiment, for example, the display panel DP may be an organic light emitting display panel including a plurality of pixels each of which is included of an organic light emitting diode. The pixels may be controlled or driven to generate and/or display the image. The organic light emitting diode in the pixels may be controlled or driven to generate and/or emit light at the pixels for generating and displaying the image.

The polarizing film POL may be positioned between the optical adhesive film OCA1 and the display panel DP. The polarizing film POL is configured to reflect external light incident thereto through the window WD from the environment external to the display device so that the image display of the display panel DP is not disturbed. The polarizing film POL may be a polarizing plate.

The cover panel CP1 may cover a non-display surface (e.g., a lower surface) of the display panel DP and may define an outer surface of the panel assembly PA11. That is, the display panel DP may be positioned between the polarizing film POL and the cover panel CP1. In an embodiment, for example, the cover panel CP1 may have a structure in which a cushioning member and a conductive thin film are laminated. The cushioning member can absorb an impact applied to the display panel DP, and the conductive thin film can cancel the electromagnetic interference applied to the display panel DP. The conductive thin film may include, for example, a copper thin film.

The cover panel CP1, the display panel DP, the polarizing film POL, the optical adhesive film OCA1 and the window WD may be laminated in a third direction DR3 (e.g., along a thickness of the panel assembly PA11 of the display device).

The plurality of members OCA1, POL, DP and CP1 may respectively include first edges E1o, E1p and E1c disposed furthest in the first direction DR1 among edges of members OCA1, POL, DP and CP1 and in contact with the first sealing member FR12. The first edges E1o, E1p and E1c each correspond to a same first side of the panel assembly PA11 (which corresponds to a same first side of the display device).

The first edge E1c is defined by the cover panel CP1. The display panel DP and/or the polarizing film POL extends further than the first edge E1c to define the first edge E1p. The optical adhesive film OCA1 extends further than the display panel DP and/or the polarizing film POL to define the first edge E1o. The window WD extends further than the optical adhesive film OCA1 to define a first edge of the window WD furthest from the first edge E1c, at a same side of the members OCA1, POL, DP and CP1 which define each of first edges E1o, E1p and E1c. Since along the cross-sectional thickness of the panel assembly PA11, the members CP1, DP, POL and OCA1 are disposed sequentially closer to the window WD, the first edges E1c, E1p and E1o may be arranged sequentially closer to the window WD and form a stepped shape along the first direction DR1. That is, at least in a portion of the panel assembly PA11, portions of the first edges E1o, E1p, and E1c may protrude sequentially at different distances from each other relative to a center or non-edge region of the panel assembly PA11 as a cross-sectional distance to the window WD decreases such that the first edges E1o, E1p, and E1c have the stepped shape.

In this embodiment and the following embodiments, for example, the polarizing film POL and the display panel DP are bonded to each other and are integrally cut to have the first edge E1p defined by individual edges that coincide with (e.g., are aligned with) each other.

The entire first edge E1o of the optical adhesive film OCA1 may protrude in the first direction DR1 from the first edge E1p of the polarizing film POL. In an embodiment, for example, the optical adhesive film OCA1 may protrude by a first distance d1 in the first direction DR1 with respect to all locations along a length of the first edge E1p of the polarizing film POL. In an embodiment, the optical adhesive film OCA1 may protrude from the first edge E1p of the polarizing film POL by a constant first distance d1 in the first direction DR1 with respect to all locations along the length of the first edge E1p of the polarizing film POL. That is, along a length of the first edge E1o, the optical adhesive film OCA1 of the panel assembly PA11 protrudes regularly from the first edge E1p of the polarizing film POL. Furthermore, since the longest member among the optical adhesive film OCA1 and the polarizing film POL is disposed closest to the water proof members, end portions of the optical adhesive film OCA1 and the polarizing film POL are considered as protruded regularly.

The entire first edge E1c of the cover panel CP1 may be recessed in a direction opposite to the first direction DR1 from the first edge E1p of the display panel DP. In an embodiment, for example, the cover panel CP1 may be recessed by a second distance d2 in the direction opposite to the first direction DR1 with respect to all locations along a length of the first edge E1p of the display panel DP. In an embodiment, the cover panel CP1 may be recessed from the first edge E1p of the display panel DP by a constant second distance d2 in the direction opposite to the first direction DR1 with respect to all locations along the length of the first edge E1p of the display panel DP. That is, along a length of the first edge E1c, the cover panel CP1 of the panel assembly PA11 is recessed regularly from the first edge E1p of the display panel DP. Furthermore, since the longest member among the display panel DP and the cover panel CP1 is disposed closest to the water proof members, end portions of the display panel DP and the cover panel CP1 are considered as protruded regularly.

Taking FIGS. 7 to 9 together, at a location where line A-A' is disposed and at a location where line C-C' is disposed, the distances d1 and d2 are the same. That is, along lengths of each of the first edges E1o, E1p and E1c, the members OCA1, POL, DP, and CP1 are protruded (or recessed) regularly at the respective distances d1 and d2. As shown by the dotted lines for each of the first edges E1o, E1p and E1c, the members OCA1, POL, DP, and CP1 are protruded (or recessed) regularly at the respective distances d1 and d2, along an entirety of the lengths of each of the first edges E1o, E1p and E1c. While the stepped space ST12 is indicated at line C-C', it will be understood that since the distances d1 and d2 are disposed along an entirety of the lengths of each of the first edges E1o, E1p and E1c, such stepped space ST12 configuration is also disposed along the entirety of the lengths of the first edges E1o, E1p and E1c.

Referring again to FIGS. 1 and 5 to 7, although not shown, a second sealing member (refer to sealing member FR12 in FIG. 6) may fill the stepped space ST13. The second sealing member may be in contact with the first waterproof member WP1, the third waterproof member WP3, the panel assembly PA, the window WD, and the housing HS.

The plurality of members OCA1, POL, DP, and CP1 may include second edges E2o, E2p, and E2c disposed furthest in a direction opposite to the first direction DR1 among edges of members OCA1, POL, DP and CP1 and in contact with the second sealing member. The second edges E2o, E2p, and E2c each correspond to a same second side of the panel assembly PA11 (which corresponds to a same second side of the display device). As similarly described above, since along the thickness of the panel assembly PA11, the members CP1, DP, POL and OCA1 are disposed sequentially closer to the window WD, the second edges E2c, E2p and E2o may be arranged sequentially closer to the window WD and form a stepped shape along the direction opposite to the first direction DR1. That is, at least in a portion of the panel assembly PA11, portions of the second edges E2o, E2p, and E2c may protrude sequentially at different distances from each other relative to a center or non-edge region of the panel assembly PA11 as a cross-sectional distance to the window WD decreases such that the second edges E2o, E2p, and E2c have the stepped shape.

The elements at the remaining stepped spaces ST24 and ST34 may also include the same configurations as those at the stepped spaces ST12 and ST13, respectively, so redundant description is omitted.

The plurality of members OCA1, POL, DP and CP1 of the panel assembly PA11 do not protrude irregularly at the stepped spaces ST12, ST13, ST24 and ST34. Therefore, since a sealing member can be completely filled in the stepped spaces ST12, ST13, ST24, and ST34 at which edges of the members OCA1, POL, DP and CP1 are exposed, the waterproof function can be effectively implemented.

Figure 10:
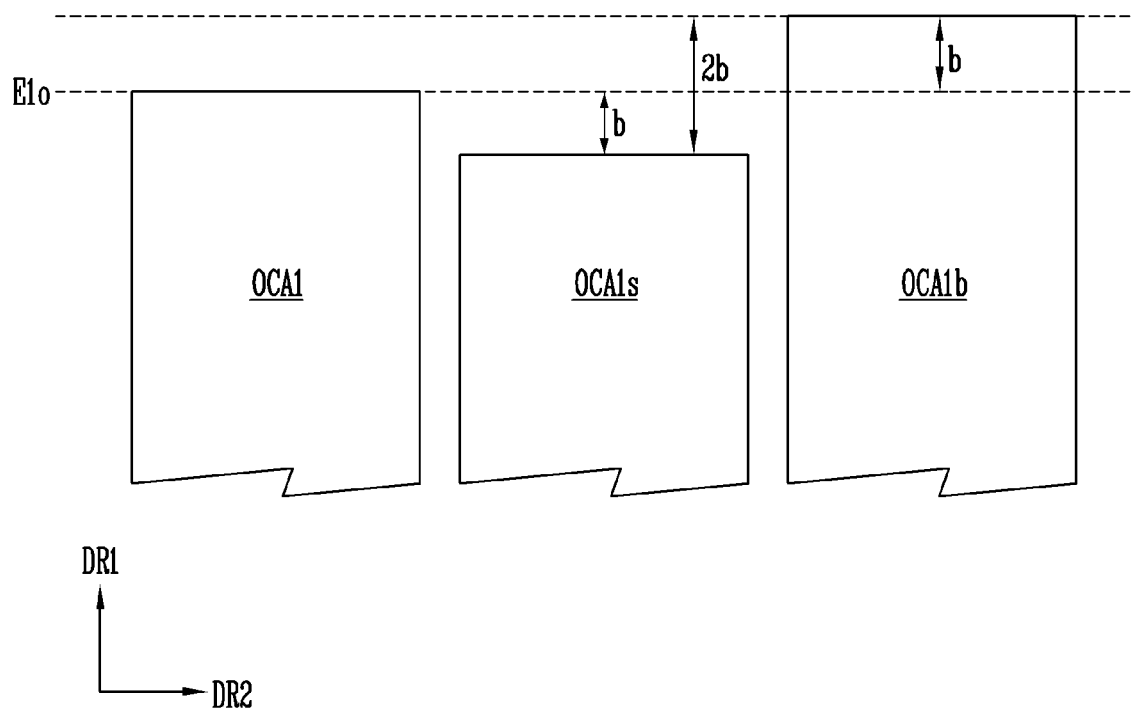
FIG. 10 is a top plan view diagram for explaining a process deviation of an optical adhesive film.

FIG. 10 is a top plan view diagram for explaining a process deviation of the optical adhesive film.

As described above, the plurality of members OCA1, POL, DP and CP1 of the panel assembly PA may have process deviations in respective manufacturing processes thereof. Also, there may be a process deviation in the process of bonding the plurality of members OCA1, POL, DP and CP1 to each other. Therefore, it is necessary to determine the first distance d1 and the second distance d2 in consideration of the process deviations.

In determining the first distance d1 as a protruded distance of a member within the panel assembly, first through fourth process deviations may be considered as follows. Hereinafter, the process deviations refer to process deviations based on the first direction DR1.

The first process deviation a may occur in a process of integrally cutting the display panel DP and the polarizing film POL.

The second process deviation b may occur in a cutting process of the optical adhesive film OCA1. Referring to FIG. 10, when the optical adhesive film OCA1 is ideally cut, the first edge E1o is defined.

When the optical adhesive film OCA1 is not ideally cut, due to the second process deviation b, an optical adhesive film OCA1s having a smallest overall length along the first direction DR1 can be produced and an optical adhesive film OCA1b having a largest overall length along the first direction DR1 can be produced. Of course, an optical adhesive film having a size between the optical adhesive film OCA1s and the optical adhesive film OCA1b may also be produced.

The third process deviation c may occur in a process of manufacturing a release paper of the optical adhesive film OCA1. Two release papers may be provided and respectively located on opposing sides of the optical adhesive film OCA1. The release paper makes recognition of the position of the optical adhesive film OCA1 possible which may otherwise be difficult to locate due to transparency of the optical adhesive film OCA1, and preserves the viscosity of the optical adhesive film OCA1. When the optical adhesive film OCA1 is adhered to another member, the release paper is removed.

The fourth process deviation d may occur in a process of adhering the optical adhesive film OCA1 and the polarizing film POL to each other. The process of adhering the optical adhesive film OCA1 and the polarizing film POL to each other may be termed a first sub-lamination process. A second sub-lamination process may be a process of adhering the optical adhesive film OCA1 and the window WD to each other.

When the first protruded distance is d1, the first process deviation is a, the second process deviation is b, the third process deviation is c, and the fourth process deviation is d, the first distance d1 may be calculated by the following Equation 1 to which the root-sum-square formula is applied.

$$d1=\sqrt{a^2+b^2+c^2+d^2} \qquad \text{[Equation 1]}$$

According to an embodiment, the second distance d2 may correspond to a fifth process deviation occurred in a process of manufacturing the cover panel CP1.

Accordingly, when the first distance d1 and the second distance d2 are determined according to the embodiment of the invention, since the plurality of members OCA1, POL, DP and CP1 do not protrude irregularly at the stepped spaces ST12, ST13, ST24 and ST34, the sealing member can be completely filled in the stepped spaces ST12, ST13, ST24 and ST34, and the waterproof function can be effectively implemented.

Figure 11:
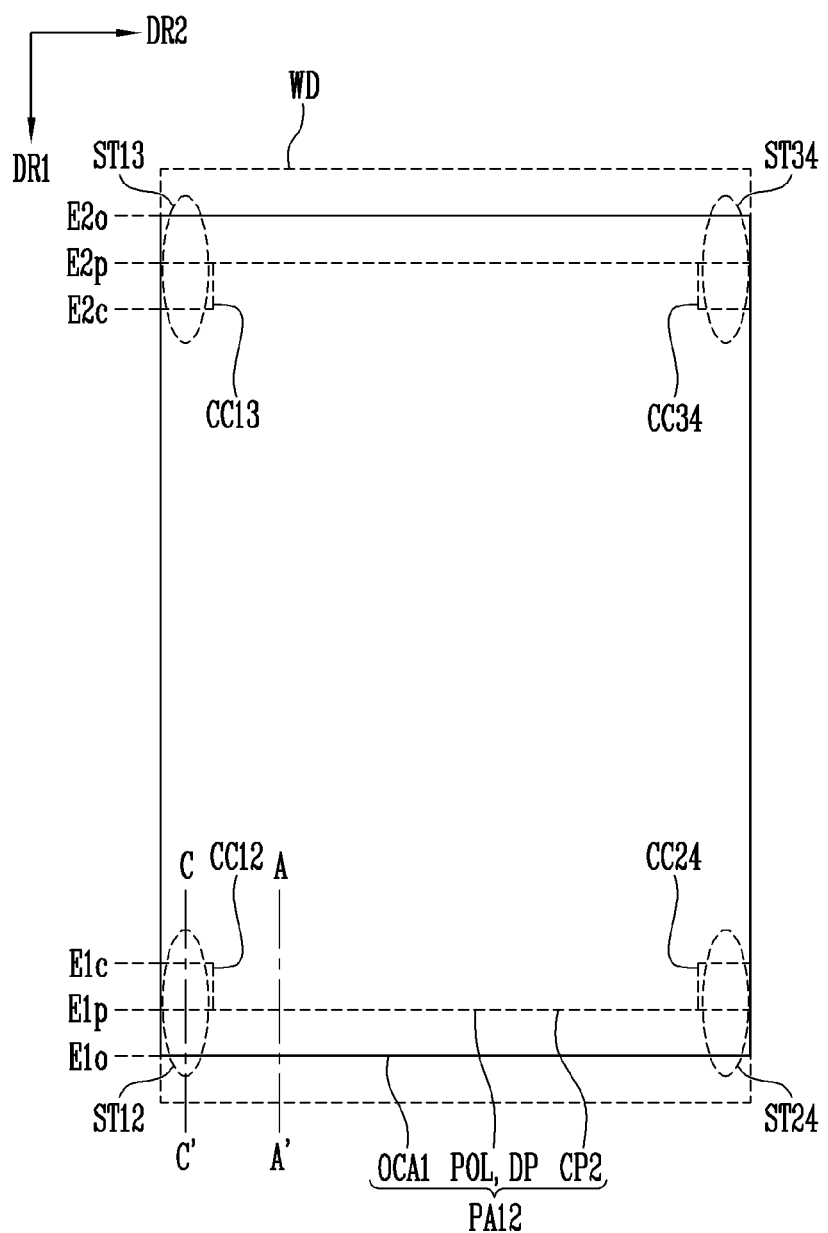
FIG. 11 is a top plan view of another embodiment of a panel assembly of a display device according to the invention.
Figure 12:
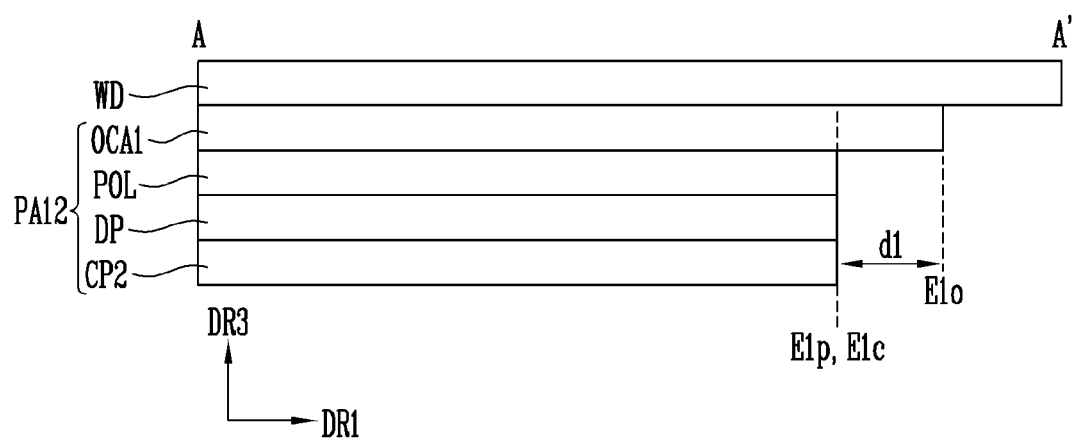
FIG. 12 is an enlarged cross-sectional view of the panel assembly of FIG. 11 according to the invention.

FIG. 11 is a top plan view of another embodiment of a panel assembly of a display device according to the invention and FIG. 12 is an enlarged cross-sectional view of the panel assembly of FIG. 11 according to the invention.

Referring to FIGS. 11 and 12, a panel assembly PA12 according to the invention may include the optical adhesive film OCA1, the polarizing film POL, and the display panel DP. Further, as another embodiment, the panel assembly PA12 may further include a cover panel CP2.

The plurality of members OCA1, POL, DP, and CP2 may include first edges E1o, E1p, and E1c disposed furthest in the first direction DR1 among edges of members OCA1, POL, DP and CP2 and in contact with the first sealing member FR12. The first edges E1o, E1p, and E1c at ends of the respective members OCA1, POL, DP, and CP2 may be protruded at different distances from a center or non-edge region of the panel assembly PA12 toward an end edge of the window WD to define a sequential stepped shape which is described above for FIGS. 7 to 9.

The entire first edge E1o of the optical adhesive film OCA1 may protrude in the first direction DR1 from the first edge E1p of the polarizing film POL. In an embodiment, for example, the optical adhesive film OCA1 may protrude by a first distance d1 in the first direction DR1 with respect to all locations along the first edge E1p of the polarizing film POL.

A first portion of the first edge E1c of the cover panel CP2 may be recessed in a direction opposite to the first direction DR1 from each of a second portion of the first edge E1c of the cover panel CP2 and the first edge E1p of the display panel DP. In an embodiment, for example, the first portion of the first edge E1c of the cover panel CP2 may be recessed by a second distance d2 in a direction opposite to the first direction DR1 with respect to the first edge E1p of the display panel DP.

The first portion of the first edge E1c of the cover panel CP2 may be a portion of the cover panel CP2 corresponding to the line C-C'. The second portion of the first edge E1c of the cover panel CP2 may be a portion of the cover panel CP2 corresponding to the line A-A'. The second portion corresponding to the line A-A' is further detailed in FIG. 12 and the first portion corresponding to the line C-C' is detailed in FIG. 9. The first and second portion of the first edge E1c of the cover panel CP2 may be collectively referred to as or form a concave portion CC12 and CC24 in the top plan view. The second portion of the first edge E1c of the cover panel CP2 does not include a stepped space formed by the cover panel CP2 and the display panel DP, since the first edges E1p and E1c are aligned with each other as shown in FIG. 12. Even if a concave portion is not formed at the first portion of the first edge E1c of the cover panel CP2, the waterproof function is not hindered.

Taking FIGS. 11 and 12 together, at a location where line A-A' is disposed, the distance d1 is the same for each of members POL, DP, and CP2 such that a stepped space may not be formed at line A-A'. Along lengths of each of the first edges E1o, E1p and E1c, the members OCA1, POL, DP, and CP2 are protruded (or recessed) regularly at the respective distances d1 and d2, as described above for FIGS. 7 to 9. As shown by the dotted lines for each of the first edges E1o, E1p and E1c in FIG. 11, the members OCA1, POL, DP, and CP2 are protruded (or recessed) regularly at the respective distances d1 and d2, along the lengths of each of the first edges E1o, E1p and E1c.

In addition, although not shown, the second sealing member may fill the stepped space ST13. The second sealing member may be in contact with the first waterproof member WP1, the third waterproof member WP3, the panel assembly PA, the window WD, and the housing HS.

The plurality of members OCA1, POL, DP, and CP2 may include second edges E2o, E2p, and E2c disposed furthest in a direction opposite to the first direction DR1 among edges of members OCA1, POL, DP and CP2 and in contact with the second sealing member. The second edges E2o, E2p, and E2c at ends of the respective members OCA1, POL, DP, and CP2 may be protruded at different distances from the center or non-edge region of the panel assembly PA12 toward an end edge of the window WD to define a sequential stepped shape which is described above for FIGS. 7 to 9.

First and second portions of the second edge E2c of the cover panel CP2 may be collectively referred to as or form a concave portion CC13 and CC34 in the top plan view, respectively, and a duplicate description thereof will be omitted.

The elements at the remaining stepped spaces ST24 and ST34 may also include the same configurations as those at the stepped spaces ST12 and ST13, respectively, so redundant description is omitted.

Accordingly, since the plurality of members OCA1, POL, DP and CP2 of the panel assembly PA12 do not protrude irregularly at the stepped spaces ST12, ST13, ST24 and ST34, the sealing member can be completely filled in the stepped spaces ST12, ST13, ST24 and ST34, and the waterproof function can be effectively implemented.

Figure 13:
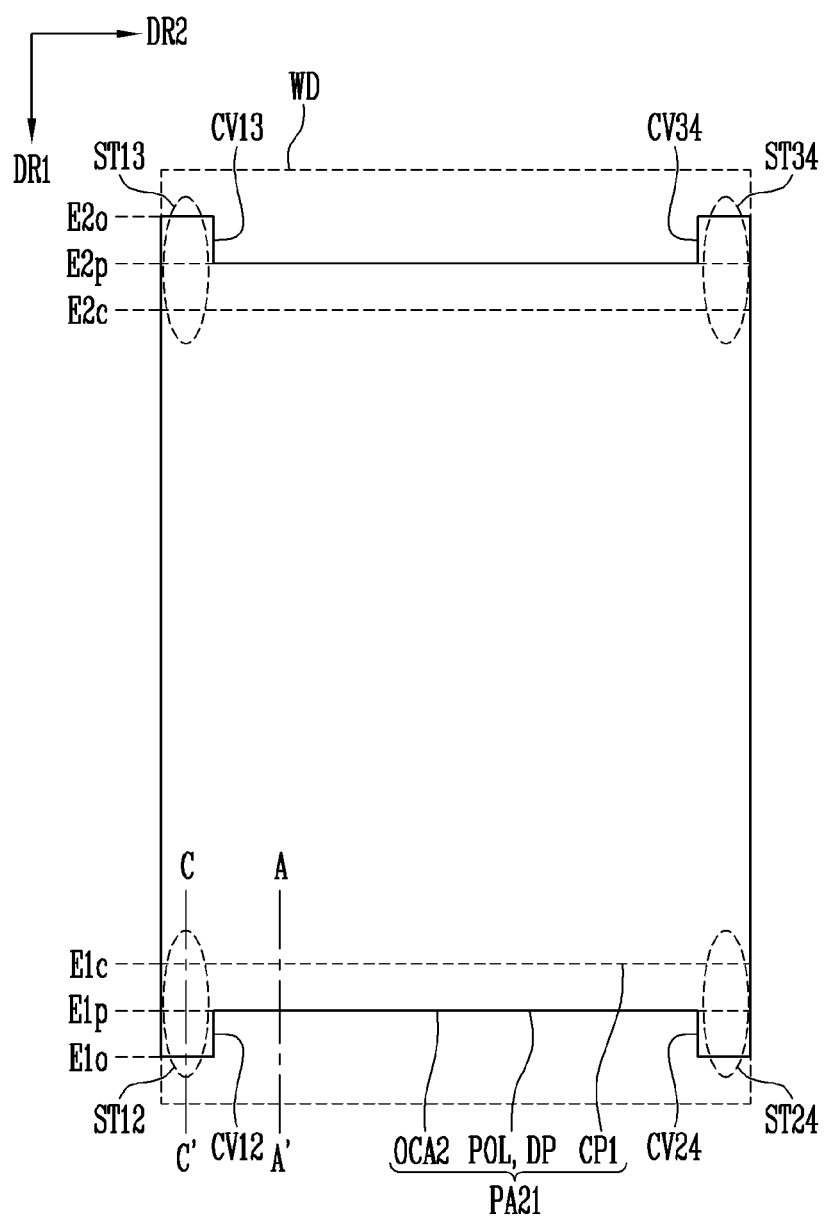
FIG. 13 is a top plan view of still another embodiment of a panel assembly of a display device according to the invention.
Figure 14:
FIG. 14 is an enlarged cross-sectional view of the panel assembly of FIG. 13 according to the invention.

FIG. 13 is a top plan view of another embodiment of a panel assembly of a display device according to the invention and FIG. 14 is an enlarged cross-sectional view of the panel assembly of FIG. 13 according to the invention.

Referring to FIGS. 13 and 14, a panel assembly PA21 according to the invention may include an optical adhesive film OCA2, the polarizing film POL, and the display panel DP. Further, as another embodiment, the panel assembly PA21 may further include the cover panel CP1.

The plurality of members OCA2, POL, DP, and CP1 may include first edges E1o, E1p, and E1c disposed furthest in the first direction DR1 among edges of members OCA2, POL, DP and CP1 and in contact with the first sealing member FR12. The first edges E1o, E1p, and E1c at ends of the respective members OCA2, POL, DP, and CP1 may be protruded at different distances from a center or non-edge region of the panel assembly PA21 toward an end edge of the window WD to define a sequential stepped shape which is described above for FIGS. 7 to 9.

A first portion of the first edge E1o of the optical adhesive film OCA2 may protrude in the first direction DR1 from each of a second portion of the first edge E1o of the optical adhesive film OCA2 and the first edge E1p of the polarizing film POL. In an embodiment, for example, the first portion of the first edge E1o of the optical adhesive film OCA2 may protrude by a first distance d1 in the first direction DR1 with respect to the first edge E1p of the polarizing film POL.

The first portion of the first edge E1o of the optical adhesive film OCA2 may be a portion of the optical adhesive film OCA2 corresponding to the line C-C'. The second portion of the first edge E1o of the optical adhesive film OCA2 may be a portion of the optical adhesive film OCA2 corresponding to the line A-A'. The second portion of the corresponding to the line A-A' is further detailed in FIG. 14 and the first portion corresponding to the line C-C' is detailed in FIG. 9. The first and second portions of the first edge E1o of the optical adhesive film OCA2 may be collectively referred to as or form a convex portion CV12 and CV24. The second portion at the first edge E1o of the optical adhesive film OCA2 does not include a stepped space formed by the optical adhesive film OCA2 and the polarizing film POL, since the first edges E1p and E1o are aligned with each other as shown in FIG. 14. Even if a convex portion is not formed at the first portion of the first edge E1o of the optical adhesive film OCA2, the waterproof function is not hindered.

As illustrated by the dotted lines in FIG. 14, the entire first edge E1c of the cover panel CP1 may be recessed in a direction opposite to the first direction DR1 from the first edge E1p of the display panel DP. In an embodiment, for example, the cover panel CP1 may be recessed by a second distance d2 in the direction opposite to the first direction DR1 with respect to the first edge E1p of the display panel DP.

Taking FIGS. 13 and 14 together, at a location where line A-A' is disposed, the distance d2 is the same for each of members OCA2, POL and DP such that a stepped space may not be formed at line A-A'. Along lengths of each of the first edges E1o, E1p and E1c, the members OCA2, POL, DP, and CP1 are protruded (or recessed) regularly at the respective distances d1 and d2, as described above for FIGS. 7 to 9. As shown by the dotted lines for each of the first edges E1o, E1p and E1c in FIG. 13, the members OCA2, POL, DP, and CP1 are protruded (or recessed) regularly at the respective distances d1 and d2, along the lengths of each of the first edges E1o, E1p and E1c.

In addition, although not shown, a second sealing member may fill the stepped space ST13. The second sealing member may be in contact with the first waterproof member WP1, the third waterproof member WP3, the panel assembly PA, the window WD, and the housing HS.

The plurality of members OCA2, POL, DP, and CP1 may include second edges E2o, E2p, and E2c disposed furthest in a direction opposite to the first direction DR1 among edges of members OCA2, POL, DP and CP1 and in contact with the second sealing member. The second edges E2o, E2p, and E2c at ends of the respective members OCA2, POL, DP, and CP1 may be protruded at different distances from the center or non-edge region of the panel assembly PA21 toward an end edge of the window WD to define a sequential stepped shape which is described above for FIGS. 7 to 9.

First and second portions of the second edge E2o of the optical adhesive film OCA2 may be collectively referred to as or form a convex portion CV13 and CV34. A duplicate description thereof will be omitted.

The remaining stepped spaces ST24 and ST34 may also include the same configurations as those at the stepped spaces ST12 and ST13, respectively, so redundant description is omitted.

The plurality of members OCA2, POL, DP and CP1 of the panel assembly PA21 do not protrude irregularly at the stepped spaces ST12, ST13, ST24 and ST34. Therefore, since the sealing member can be completely filled in the stepped spaces ST12, ST13, ST24, and ST34, the waterproof function can be effectively implemented.

Figure 15:
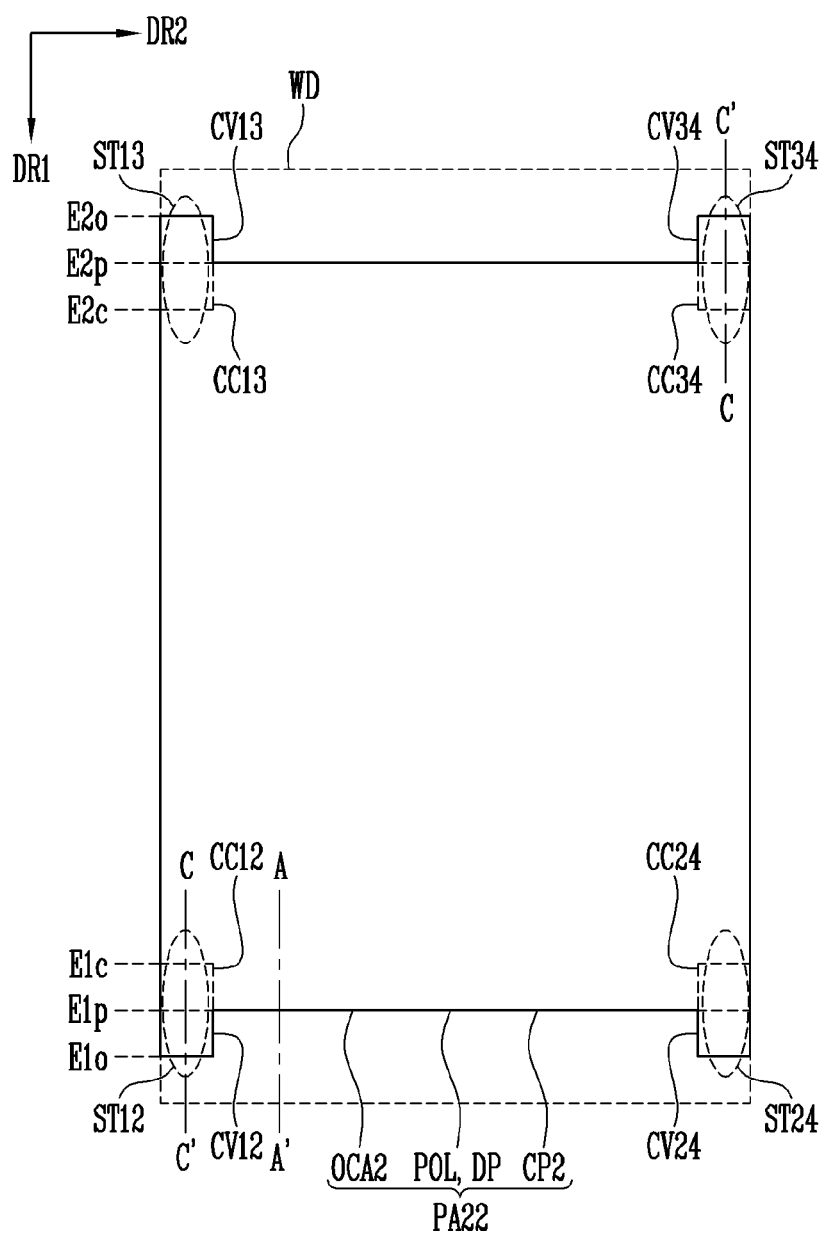
FIG. 15 is a top plan view of yet another embodiment of a panel assembly of a display device according to the invention.
Figure 16:
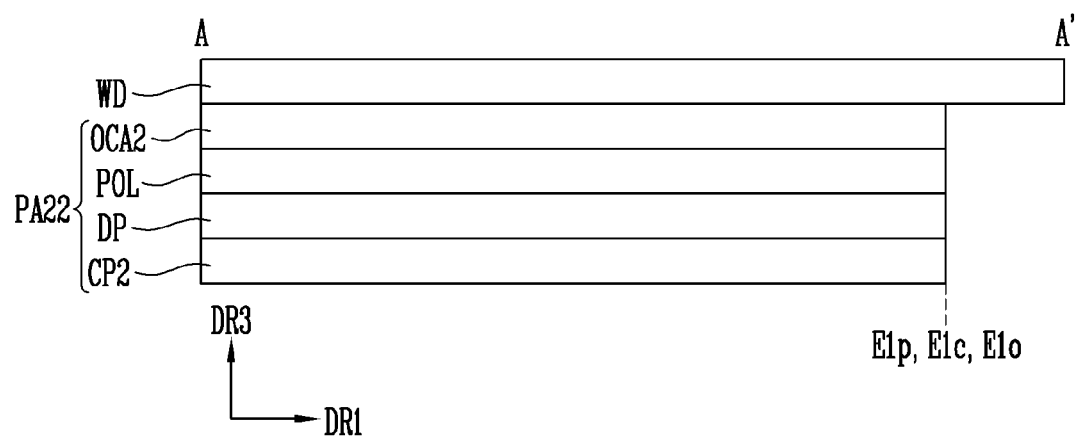
FIG. 16 is an enlarged cross-sectional view of the panel assembly of FIG. 15 according to the invention.

FIG. 15 is a top plan view of yet another embodiment of a panel assembly of a display device according to the invention and FIG. 16 is an enlarged cross-sectional view of the panel assembly in in FIG. 15 according to the invention.

Referring to FIGS. 15 and 16, a panel assembly PA22 according to the invention may include the optical adhesive film OCA2 (also disclosed in FIGS. 11 and 12), the polarizing film POL, and the display panel DP. Further, as another embodiment, the panel assembly PA22 may further include the cover panel CP2 (also disclosed in FIGS. 13 and 14).

The plurality of members OCA2, POL, DP, and CP2 may include the first edges E1o, E1p, and E1c disposed furthest in the first direction DR1 among edges of members OCA2, POL, DP and CP2 and in contact with the first sealing member FR12. At least in a portion of the panel assembly PA22, portions of the first edges E1o, E1p, and E1c may protrude sequentially at different distances from each other relative to a center or non-edge region of the panel assembly PA22 as a cross-sectional distance to the window WD decreases such that the first edges E1o, E1p, and E1c have a stepped shape which is described above for FIGS. 7 to 9.

A first portion of the first edge E1o of the optical adhesive film OCA2 may protrude in the first direction DR1 from each of a second portion of the first edge E1o of the optical adhesive film OCA2 and the first edge E1p of the polarizing film POL. In an embodiment, for example, the first portion of the first edge E1o of the optical adhesive film OCA2 may protrude by a first distance d1 in the first direction DR1 with respect to the first edge E1p of the polarizing film POL.

The first portion of the first edge E1o of the optical adhesive film OCA2 may be a portion corresponding to the line C-C'. The second portion of the first edge E1o of the optical adhesive film OCA2 may be a portion corresponding to the line A-A'. The second portion corresponding to the line A-A' is further detailed in FIG. 16 and the first portion corresponding to the line C-C' is detailed in FIG. 9. The first and second portions of the first edge E1o of the optical adhesive film OCA2 may be collectively referred to as or form the convex portion CV12 and CV24 in the top plan view. The second portion of the first edge E1o of the optical adhesive film OCA2 does not include a stepped space formed by the optical adhesive film OCA2 and the polarizing film POL, since the first edges E1p and E1o are aligned with each other as shown in FIG. 16. Even if a convex portion is not formed at the first portion of the first edge E1o of the optical adhesive film OCA2, the waterproof function is not hindered.

A first portion of the first edge E1c of the cover panel CP2 may be recessed in a direction opposite to the first direction DR1 from each of a second portion of the first edge E1c of the cover panel CP2 and the first edge E1p of the display panel DP. In an embodiment, for example, the first portion of the first edge E1c of the cover panel CP2 may be recessed by a second distance d2 in a direction opposite to the first direction DR1 with respect to the first edge E1p of the display panel DP.

The first portion of the first edge E1c of the cover panel CP2 may be a portion corresponding to the line C-C'. The second portion of the first edge E1c of the cover panel CP2 may be a portion corresponding to the line A-A'. The second portion corresponding to the line A-A' is further detailed in FIG. 16 and the first portion corresponding to the line C-C' is detailed in FIG. 9. The first and second portions of the first edge E1c of the cover panel CP2 may be collectively referred to as or form a concave portion CC12 and CC24. The second portion of the first edge E1c of the cover panel CP2 does not include a stepped space formed by the cover panel CP2 and the display panel DP, since the first edges E1p and E1c are aligned with each other as shown in FIG. 16. Even if a concave portion is not formed at the second portion of the first edge E1c of the cover panel CP2, the waterproof function is not hindered.

In addition, although not shown, the second sealing member may fill the stepped space ST13. The second sealing member may be in contact with the first waterproof member WP1, the third waterproof member WP3, the panel assembly PA, the window WD, and the housing HS.

The plurality of members OCA2, POL, DP, and CP2 may include second edges E2o, E2p, and E2c disposed furthest in a direction opposite to the first direction DR1 among edges of members OCA2, POL, DP and CP2 and in contact with the second sealing member. At least in a portion of the panel assembly PA22, portions of the second edges E2o, E2p, and E2c may protrude sequentially at different distances from each other relative to a center or non-edge region of the panel assembly PA22 as a cross-sectional distance to the window WD decreases such that the second edges E2o, E2p, and E2c have a stepped shape which is described above for FIGS. 7 to 9.

First and second portions of the second edge E2o of the optical adhesive film OCA2 may be collectively referred to as or form the convex portion CV13 and CV34. A duplicate description thereof will be omitted.

First and second portions of the second edge E2c of the cover panel CP2 may be collectively referred to as or form the concave portion CC13 and CC34, and a duplicate description thereof will be omitted.

The remaining stepped spaces ST24 and ST34 may also include the same configurations as those at the stepped spaces ST12 and ST13, respectively, so redundant description is omitted.

The plurality of members OCA2, POL, DP and CP2 of the panel assembly PA22 do not protrude irregularly at the stepped spaces ST12, ST13, ST24 and ST34. Therefore, since the sealing member can be completely filled in the stepped spaces ST12, ST13, ST24, and ST34, the waterproof function can be effectively implemented.

Figure 17:
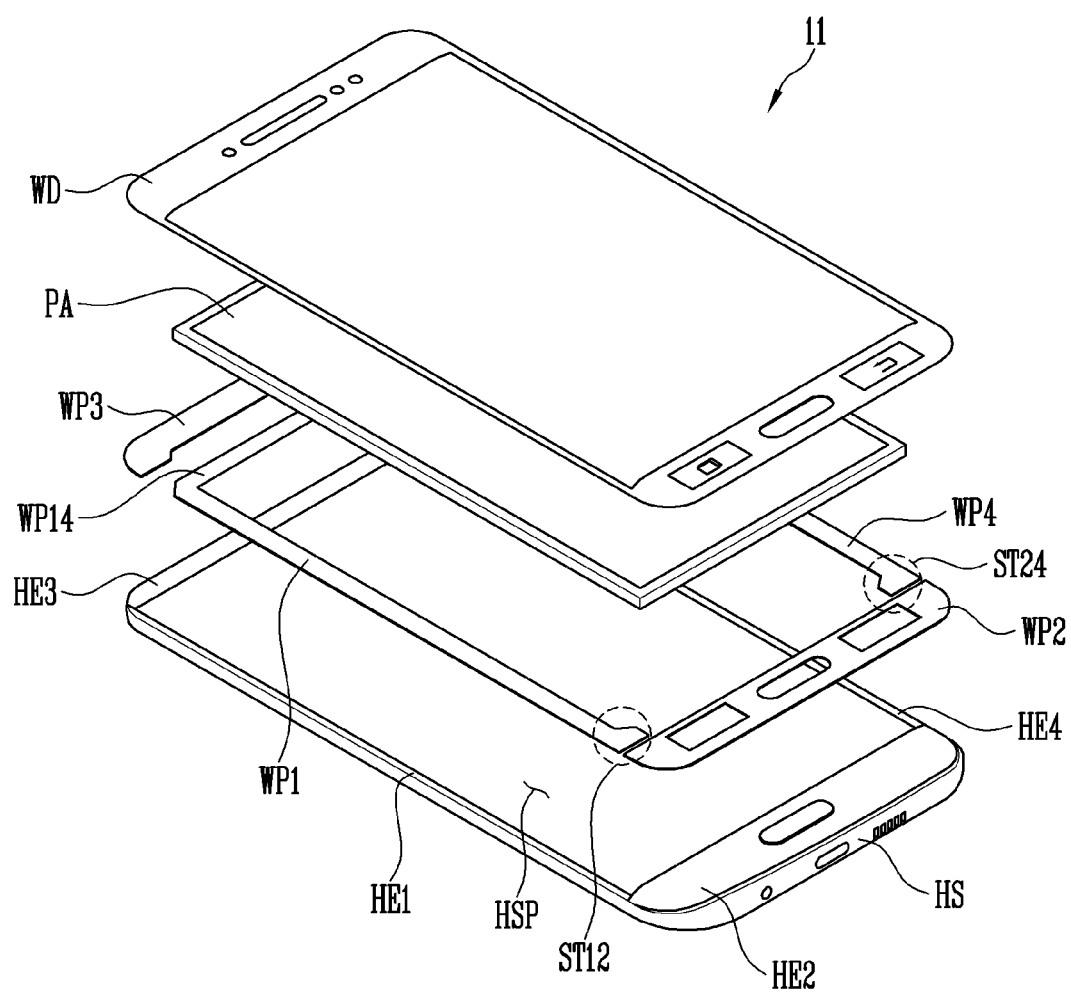
FIG. 17 is a perspective view illustrating another embodiment of a display device according to the invention.

FIG. 17 is a perspective view illustrating another embodiment of a display device according to the invention.

A display device 11 of FIG. 17 differs from the display device 10 of FIG. 1 in that it further includes a fifth waterproof member WP14.

The fifth waterproof member WP14 may lengthwise extend in a width direction of the display device 11. The fifth waterproof member WP14 may connect the first waterproof member WP1 and the fourth waterproof member WP4 to each other. The fifth waterproof member WP14, the first waterproof member WP1, and the fourth waterproof member WP4 may be integrally formed. That is, one of the fifth waterproof member WP14, the first waterproof member WP1, and the fourth waterproof member WP4 may extend to define any other among fifth waterproof member WP14, the first waterproof member WP1, and the fourth waterproof member WP4. The fifth waterproof member WP14 may adhere the panel assembly PA to a portion of the housing HS. In an embodiment, the fifth waterproof member WP14 in FIG. 17 may replace the third waterproof member WP3 introduced in FIG. 1, such that a collective waterproof member includes only WP1, WP14 and WP4.

Although there are stepped spaces ST12 and ST24 in this embodiment, unlike the display device 10 of FIG. 1, there are no stepped spaces ST13 and ST34. That is, since the fifth waterproof member WP14 is connected to each of the first waterproof member WP1 and the fourth waterproof member WP4 at second side corners of the panel assembly PA, there are no stepped spaces ST13 and ST34.

Since the remaining configuration of the display device 11 of FIG. 17 is substantially the same as that of the display device 10 of FIG. 1, duplicated description is omitted.

Figure 18:
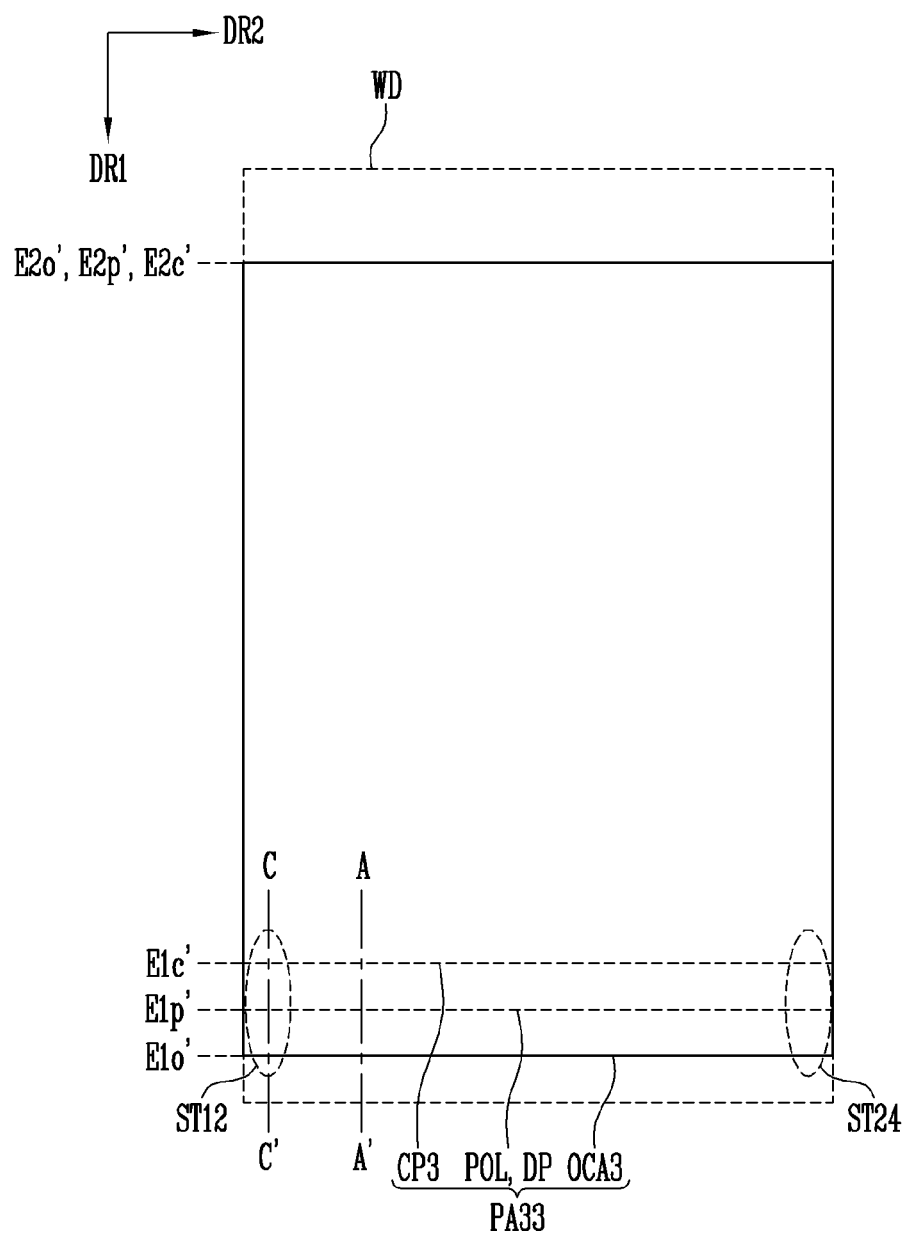
FIG. 18 is a top plan view of yet another embodiment of a panel assembly of a display device according to the invention.

FIG. 18 is a top plan view of yet another embodiment of a panel assembly of a display device according to the invention.

Referring to FIG. 18, a panel assembly PA33 according to the invention may include an optical adhesive film OCA3, the polarizing film POL, and the display panel DP. Further, as another embodiment, the panel assembly PA33 may further include a cover panel CP3.

First edges E1c', E1p', and E1o' of the panel assembly PA33 of FIG. 18 are substantially the same as the first edges E1c, E1p, and E1o of the panel assembly PA11 of FIG. 7. Thus, duplicated description is omitted.

In the panel assembly PA33 of FIG. 18, the plurality of members OCA3, POL, DP, and CP3 may include second edges E2o', E2p', and E2c' disposed furthest in a direction opposite to the first direction DR1. The second edges E2o', E2p', and E2c' may coincide with (e.g., be aligned with) each other along the third direction DR3.

In the panel assembly PA33 of FIG. 18, the second edges E2o', E2p', and E2c' may irregularly protrude in the direction opposite to the first direction DR1 due to process deviations. However, unlike the display device 10 of FIG. 1, since the stepped spaces ST13 and ST34 are not included, the sealing member is not filled. Therefore, a problem that the stepped spaces ST13 and ST34 are not filled with the sealing member does not occur. Referring to FIGS. 16 and 18, for example, since the second edges E2o', E2p', and E2c' are aligned with each other as similarly shown for the first edges E1c, E1p and E1o at line A-A' in FIG. 16, there are no stepped spaces ST13 and ST34 in which to fill the sealing member.

Figure 19:
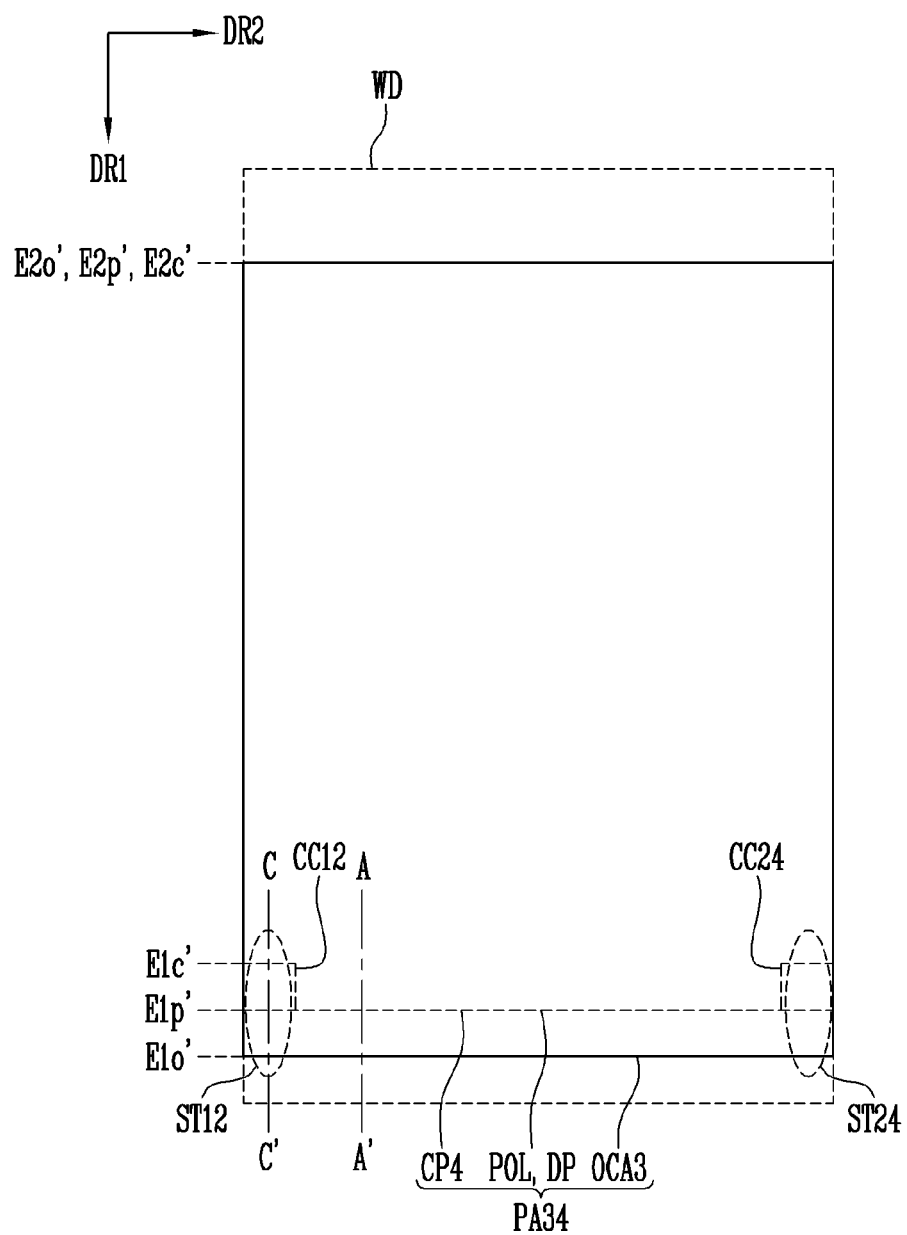
FIG. 19 is a top plan view of yet another embodiment of a panel assembly of a display device according to the invention.

FIG. 19 is a top plan view of yet another embodiment of a panel assembly of a display device according to the invention.

Referring to FIG. 19, a panel assembly PA34 according to the invention may include the optical adhesive film OCA3, the polarizing film POL, and the display panel DP. Further, as another embodiment, the panel assembly PA34 may further include a cover panel CP4.

The first edges E1c', E1p', and E1o' of the panel assembly PA34 of FIG. 19 are substantially the same as the first edges E1c, E1p, and E1o of the panel assembly PA12 of FIG. 11. Thus, duplicated description is omitted.

In the panel assembly PA34 of FIG. 19, the plurality of members OCA3, POL, DP, and CP4 may include second edges E2o', E2p', and E2c' disposed furthest in a direction opposite to the first direction DR1. The second edges E2o', E2p', and E2c' may coincide with each other along the third direction DR3.

Similar to that described for the panel assembly PA33 of FIG. 18, in the panel assembly PA34 of FIG. 19, the second edges E2o', E2p', and E2c' may irregularly protrude in the direction opposite to the first direction DR1 due to process deviations. However, unlike the display device 10 of FIG. 1, since the stepped spaces ST13 and ST34 are not included, the sealing member is not filled. Therefore, a problem that the stepped spaces ST13 and ST34 are not filled with the sealing member does not occur.

Figure 20:
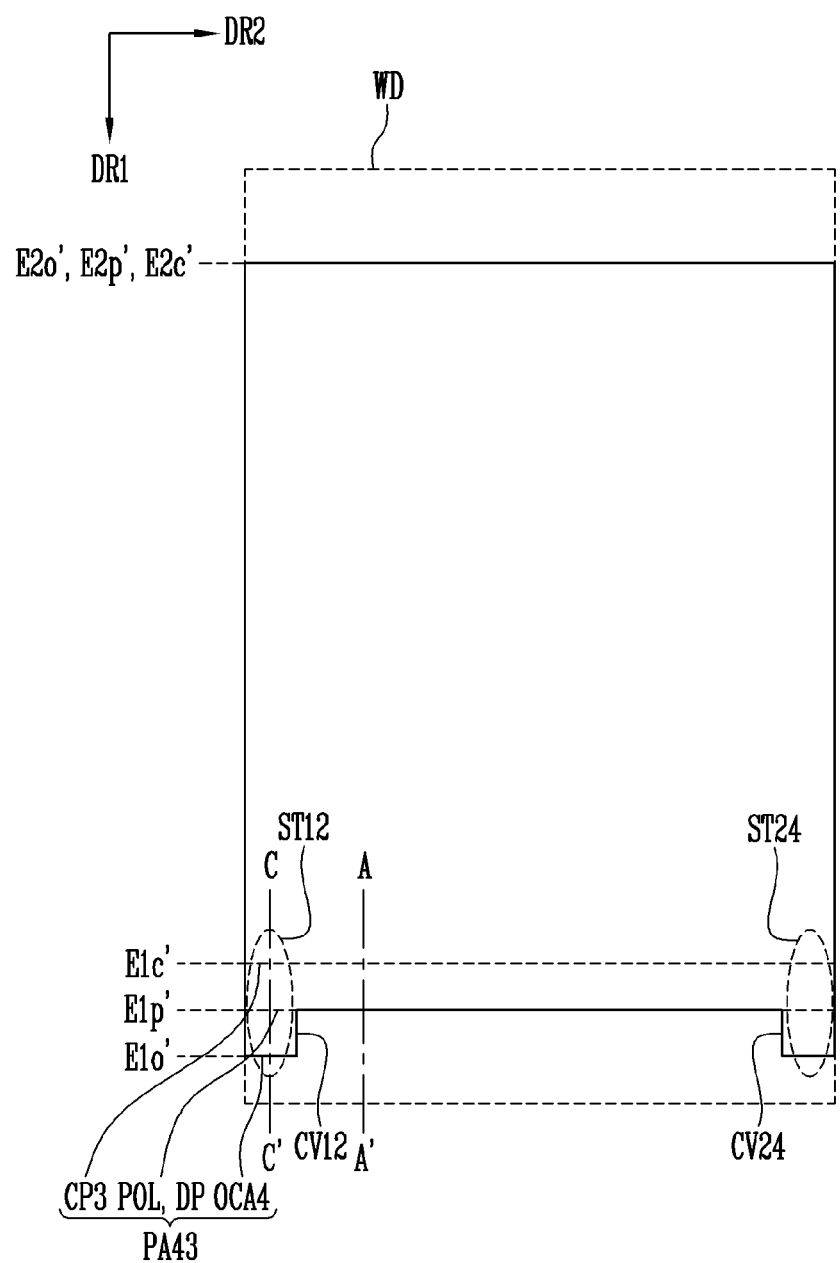
FIG. 20 is a top plan view of yet another embodiment of a panel assembly of a display device according to the invention.

FIG. 20 is a top plan view of yet another embodiment of a panel assembly of a display device according to the invention.

Referring to FIG. 20, a panel assembly PA43 according to the invention may include an optical adhesive film OCA4, the polarizing film POL, and the display panel DP. Further, as another embodiment, the panel assembly PA43 may further include the cover panel CP3.

The first edges E1c', E1p', and E1o' of the panel assembly PA43 of FIG. 20 are substantially the same as the first edges E1c, E1p, and E1o of the panel assembly PA21 of FIG. 13. Thus, duplicated description is omitted.

In the panel assembly PA43 of FIG. 20, the plurality of members OCA4, POL, DP and CP3 may include second edges E2o', E2p', and E2c' disposed furthest in the direction opposite to the first direction DR1. The second edges E2o', E2p', and E2c' may coincide with each other along the third direction DR3.

Similar to that described for the panel assembly PA33 of FIG. 18, in the panel assembly PA43 of FIG. 20, the second edges E2o', E2p', and E2c' may irregularly protrude in the direction opposite to the first direction DR1 due to process deviations. However, unlike the display device 10 of FIG. 1, since the stepped spaces ST13 and ST34 are not included, the sealing member is not filled. Therefore, a problem that the stepped spaces ST13 and ST34 are not filled with the sealing member does not occur.

Figure 21:
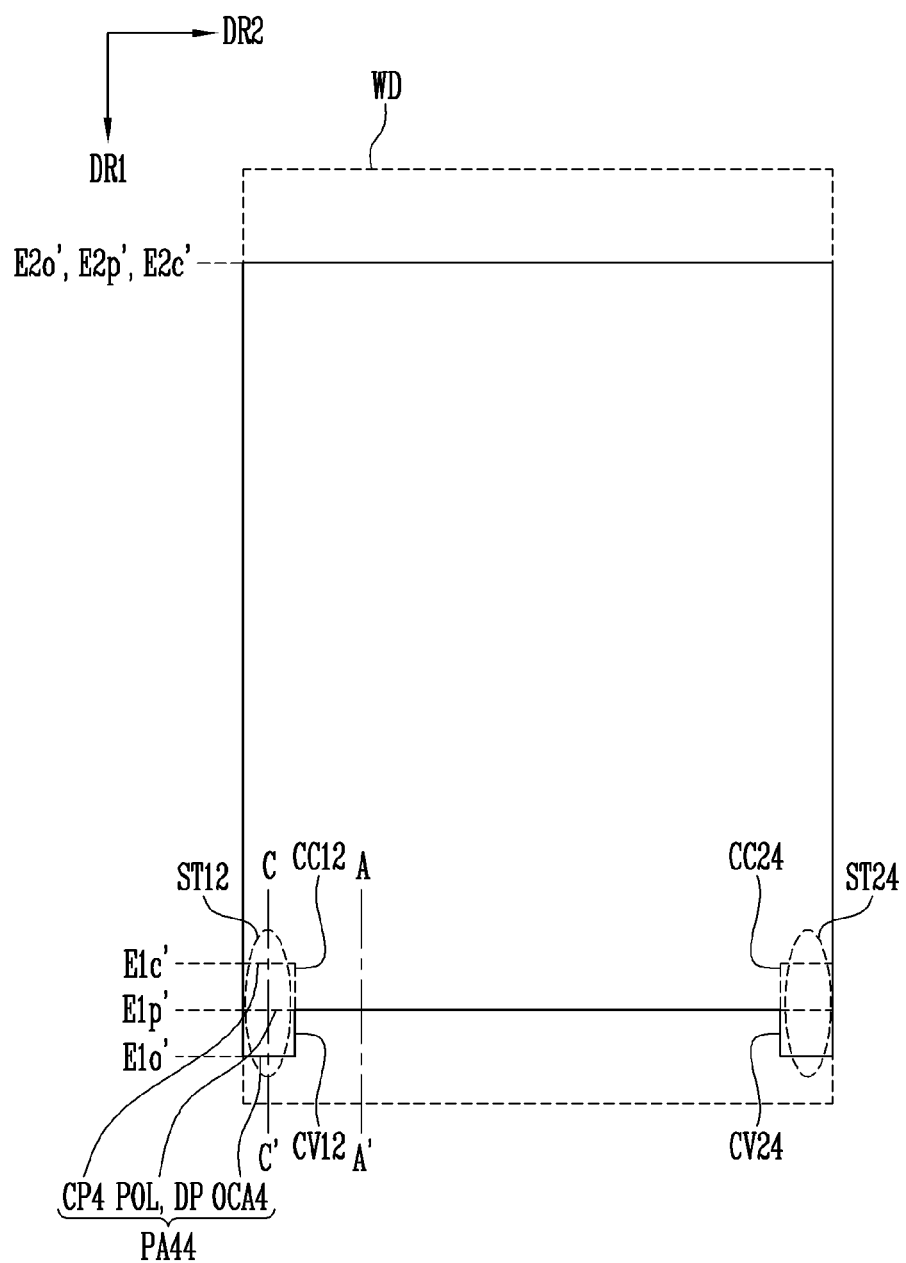
FIG. 21 is a top plan view of yet another embodiment of a panel assembly according to the invention.

FIG. 21 is a top plan view of yet another embodiment of a panel assembly of a display device according to the invention.

Referring to FIG. 21, a panel assembly PA44 according to the invention may include the optical adhesive film OCA4, the polarizing film POL, and the display panel DP. Further, as another embodiment, the panel assembly PA44 may further include a cover panel CP34.

The first edges E1c', E1p', and E1o' of the panel assembly PA44 of FIG. 21 are substantially the same as the first edges E1c, E1p, and E1o of the panel assembly PA22 of FIG. 15. Thus, duplicated description is omitted.

In the panel assembly PA44 of FIG. 21, the plurality of members OCA4, POL, DP and CP4 may include second edges E2o', E2p', and E2c' disposed furthest in the direction opposite to the first direction DR1. The second edges E2o', E2p', and E2c' may coincide with each other in the third direction DR3.

Similar to that described for the panel assembly PA33 of FIG. 18, in the panel assembly PA44 of FIG. 21, the second edges E2o', E2p', and E2c' may irregularly protrude in the direction opposite to the first direction DR1 due to process deviations. However, unlike the display device 10 of FIG. 1, since the stepped spaces ST13 and ST34 are not included, the sealing member is not filled. Therefore, a problem that the stepped spaces ST13 and ST34 are not filled with the sealing member does not occur.

The display device according to one or more embodiment of the invention may include a waterproof structure that can be combined with members of various shapes in the minimized bezel area of the display device.

The drawings referred to heretofore and the detailed description of the invention described above are merely illustrative of the invention. It is to be understood that the invention has been disclosed for illustrative purposes only and is not intended to limit the scope of the invention. Therefore, those skilled in the art will appreciate that various modifications and equivalent embodiments are possible without departing from the scope of the invention. Accordingly, the true scope of the invention should be determined by the technical idea of the appended claims.

What is claimed is:

1. A display device comprising:
a housing;
a first tape disposed on the housing;
a panel assembly disposed on the first tape; and
a window disposed on the panel assembly;
wherein the first tape, the panel assembly, and the window form a stepped shape, and
wherein the panel assembly includes:
a cover panel disposed on the first tape;
a display panel disposed on the cover panel;
a polarizing film disposed on the display panel, the polarizing film having a first edge aligned with a first edge of the display panel; and
an optical adhesive film disposed on the polarizing film, the optical adhesive film having a first edge protruded from the first edge of the polarizing film, and
wherein a first edge of the window is protruded from the first edge of the optical adhesive film.

2. The display device of claim 1,
wherein the housing includes a first edge area extending along a first direction and a second edge area extending along a second direction intersecting the first direction,
wherein the first tape is between the panel assembly and the housing at the first edge area, and
wherein the display device further comprises a second tape between the window and the housing at the second edge area, the second tape being disconnected from the first tape along the first direction to define a space therebetween along the first direction.

3. The display device of claim 2,
wherein the first edge of the polarizing film, the first edge of the display panel and the first edge of the optical adhesive film are each disposed in the space between the first and second tapes.

4. The display device of claim 2,
wherein the housing further includes a third edge area extending along the second direction and spaced apart from the second edge area along the first direction,
wherein the display device further comprises a third tape between the window and the housing at the third edge area,
wherein a plurality of members of the panel assembly respectively define second edges thereof which are opposite to the first edges thereof,
wherein a second edge of the polarizing film is aligned with a second edge of the display panel,
wherein a second edge of the optical adhesive film is protruded from the second edge of the polarizing film, and
wherein a second edge of the window is protruded from the second edge of the optical adhesive film.

5. The display device of claim 4,
wherein a second sealing member is in contact with each of the first tape, the third tape, the panel assembly, the window and the housing.

6. The display device of claim 2,
wherein a plurality of members of the panel assembly respectively define second edges thereof which are opposite to the first edges thereof, the second edges being aligned with each other.

7. The display device of claim 2,
wherein a first sealing member is in contact with each of the first tape, the second tape, the panel assembly, the window and the housing, at the space between the first and second tapes.

8. The display device of claim 1,
wherein an entirety of the first edge of the optical adhesive film is protruded further than an entirety of the first edge of the polarizing film.

9. The display device of claim 1,
wherein a first edge of the cover panel is protruded further than a first edge of the first tape.

10. The display device of claim 1,
wherein a first portion of a first edge of the cover panel is concave with respect to a second portion of the first edge of the cover panel.

11. The display device of claim 1,
wherein a first protruded distance of the optical adhesive film is defined by:
a first process deviation of a first cutting process in which the display panel and the polarizing film are cut together at the first edges thereof,
a second process deviation of a second cutting process in which the optical adhesive film is cut at the first edge thereof,
a third process deviation of a manufacturing process in which a release paper which is removably applied to the optical adhesive film is manufactured, and
a fourth process deviation of an adhesive process in which the optical adhesive film and the polarizing film are adhered to each other.

12. The display device of claim 11,
wherein the first protruded distance is calculated by the following Equation 1 when the first protruded distance is d1, the first process deviation is a, the second process deviation is b, the third process deviation is c and the fourth process deviation is d.

$$d1=\sqrt{a^2+b^2+c^2+d^2} \qquad \text{[Equation 1]}$$

13. The display device of claim 12,
wherein a second protruded distance of the cover panel corresponds to a fifth process deviation of a manufacturing process in which the cover panel is manufactured.

14. The display device of claim 1,
wherein a first portion of the first edge of the optical adhesive film is concave with respect to a second portion of the first edge of the optical adhesive film.

* * * * *